(12) United States Patent
Ahn et al.

(10) Patent No.: US 11,563,023 B2
(45) Date of Patent: Jan. 24, 2023

(54) SEMICONDUCTOR DEVICE WITH REDUCED VERTICAL HEIGHT

(71) Applicant: SAMSUNG ELECTRONICS CO., LTD., Suwon-si (KR)

(72) Inventors: Jongseon Ahn, Suwon-si (KR); Youngjin Kwon, Suwon-si (KR); Jeehoon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 16/792,256

(22) Filed: Feb. 16, 2020

(65) Prior Publication Data
US 2020/0402997 A1 Dec. 24, 2020

(30) Foreign Application Priority Data
Jun. 24, 2019 (KR) .................. 10-2019-0075225

(51) Int. Cl.
| | |
|---|---|
| *H01L 27/11582* | (2017.01) |
| *H01L 27/1157* | (2017.01) |
| *H01L 27/11565* | (2017.01) |
| *H01L 29/423* | (2006.01) |

(52) U.S. Cl.
CPC .... *H01L 27/11582* (2013.01); *H01L 27/1157* (2013.01); *H01L 27/11565* (2013.01); *H01L 29/42328* (2013.01)

(58) Field of Classification Search
CPC .............. H01L 27/11519–11597; H01L 2221/1042–1047; H01L 21/7682
See application file for complete search history.

(56) References Cited

U.S. PATENT DOCUMENTS

| | | |
|---|---|---|
| 7,969,789 B2 | 6/2011 | Katsumata et al. |
| 8,644,707 B2 | 3/2014 | Kim et al. |
| 8,723,247 B2 | 5/2014 | Komori et al. |
| 8,928,063 B2 | 1/2015 | Kim et al. |
| 8,971,118 B2 | 3/2015 | Jin et al. |
| 8,987,801 B2 | 3/2015 | Sakui |
| 8,987,803 B2 | 3/2015 | Chae et al. |
| 9,634,024 B2 | 4/2017 | Kanamori et al. |

(Continued)

FOREIGN PATENT DOCUMENTS

KR        10-0976064        8/2010

*Primary Examiner* — Allen L Parker
*Assistant Examiner* — Gustavo G Ramallo
(74) *Attorney, Agent, or Firm* — Volentine, Whitt & Francos, PLLC

(57) ABSTRACT

A semiconductor device includes a channel structure arranged on a substrate and extending in a first direction perpendicular to a top surface of the substrate, the channel structure including a channel layer and a gate insulating layer; a plurality of insulating layers arranged on the substrate and surrounding the channel structure, the plurality of insulating layers spaced apart from each other in the first direction; a plurality of first gate electrodes surrounding the channel structure; and a plurality of second gate electrodes surrounding the channel structure. Between adjacent insulating layers from among the plurality of insulating layers are arranged a first gate electrode from among the plurality of first gate electrodes spaced apart along the first direction from a second gate electrode from among the plurality of second gate electrodes.

12 Claims, 28 Drawing Sheets

(56) References Cited

U.S. PATENT DOCUMENTS

| | | | | |
|---|---|---|---|---|
| 10,141,221 B1* | 11/2018 | Lai | .................... | H01L 21/76831 |
| 2015/0318295 A1 | 11/2015 | Kai et al. | | |
| 2015/0380431 A1* | 12/2015 | Kanamori | ........... | H01L 27/1157 |
| | | | | 257/324 |
| 2017/0098659 A1* | 4/2017 | Yoshimizu | ........ | H01L 27/11582 |

* cited by examiner

SEMICONDUCTOR DEVICE WITH REDUCED VERTICAL HEIGHT

CROSS-REFERENCE TO RELATED APPLICATION

A claims for priority under 35 U.S.C. § 119 is made to Korean Patent Application No. 10-2019-0075225, filed on Jun. 24, 2019 in the Korean Intellectual Property Office, the entirety of which is incorporated herein by reference.

BACKGROUND

The inventive concepts herein relate to semiconductor devices and manufacturing methods of semiconductor devices, and more particularly to semiconductor devices including a channel structure extending in a vertical direction and manufacturing methods of such semiconductor devices.

As the degree of integration of memory devices increases, memory devices having vertical transistor structure in contrast to generally planar transistor structure have been developed. Memory devices having vertical transistor structure include a channel structure extending in a vertical direction on a substrate. However, as the integration degree of memory devices increases, the number of gate electrode layers stacked in the vertical direction increases, and thus the difficulty of manufacturing processes may increase.

SUMMARY

The inventive concepts provide a semiconductor device including a plurality of pairs of gate electrodes having reduced height in a vertical direction.

The inventive concepts provide a manufacturing method of a semiconductor device to prevent collapsing or falling of a mold stack during processes of forming a plurality of pairs of gate electrodes having reduced height in a vertical direction.

Embodiments of the inventive concepts provide a semiconductor device including a channel structure arranged on a substrate and extending in a first direction perpendicular to a top surface of the substrate, the channel structure including a channel layer and a gate insulating layer; a plurality of insulating layers arranged on the substrate and surrounding the channel structure, the plurality of insulating layers spaced apart from each other in the first direction; a plurality of first gate electrodes surrounding the channel structure; and a plurality of second gate electrodes surrounding the channel structure. Between adjacent insulating layers from among the plurality of insulating layers are arranged a first gate electrode from among the plurality of first gate electrodes spaced apart along the first direction from a second gate electrode from among the plurality of second gate electrodes.

Embodiments of the inventive concepts further provided a semiconductor device including a channel structure arranged on a substrate and extending in a first direction perpendicular to a top surface of the substrate, the channel structure including a channel layer and a gate insulating layer; a plurality of insulating layers arranged on the substrate and surrounding the channel structure, the plurality of insulating layers being apart from each other in the first direction; a plurality of pairs of gate electrodes respectively arranged between adjacent insulating layers from among the plurality of insulating layers, each of the pairs of gate electrodes including a first gate electrode and a second gate electrode spaced apart from each other; and cover insulating layer structures surrounding the channel structure between the first gate electrode and the second gate electrode of each of the plurality of pairs of gate electrodes, the cover insulating layer structures covering edge portions of the plurality of pairs of gate electrodes.

Embodiments of the inventive concepts still further provide a semiconductor device including a channel structure arranged on a substrate and extending in a first direction perpendicular to a top surface of the substrate, the channel structure including a channel layer and a gate insulating layer; a plurality of insulating layers arranged on the substrate and surrounding the channel structure, the plurality of insulating layers spaced apart from each other in the first direction; a plurality of first gate electrodes surrounding the channel structure; and a plurality of second gate electrodes surrounding the channel structure. Between adjacent insulating layers from among the plurality of insulating layers are arranged a first gate electrode from among the plurality of first gate electrodes spaced apart along the first direction from a second gate electrode from among the plurality of second gate electrodes, and an air space between the first gate electrode and the second gate electrode.

BRIEF DESCRIPTION OF THE DRAWINGS

Embodiments of the Inventive Concepts Will be More Clearly Understood from the Following Detailed Description Taken in Conjunction with the Accompanying Drawings in which.

DETAILED DESCRIPTION OF THE EMBODIMENTS

Hereinafter, embodiments of the inventive concepts will be described in detail with reference to the accompanying drawings.

Figure 1:
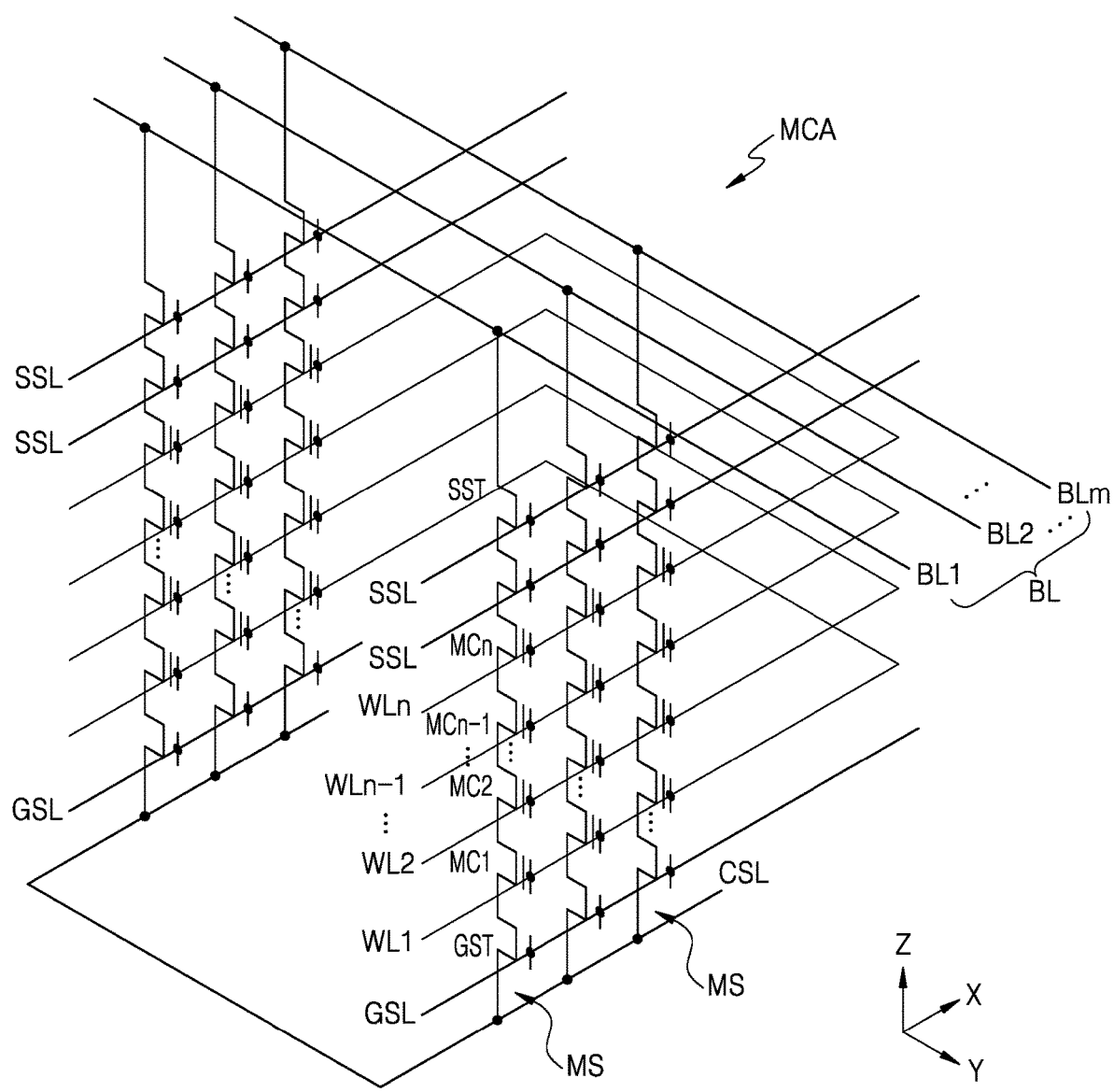
FIG. 1 illustrates an equivalent circuit diagram of a memory cell array of a semiconductor device according to example embodiments of the inventive concepts.

FIG. 1 illustrates an equivalent circuit diagram of a memory cell array MCA of a semiconductor device according to example embodiments of the inventive concepts. More particularly, FIG. 1 illustrates an equivalent circuit diagram of a vertical NAND (VNAND) flash memory device having a vertical channel structure.

Referring to FIG. 1, the memory cell array MCA may include a plurality of memory cell strings MS arranged in a vertical direction (Z direction in FIG. 1) on a substrate (not shown). Each of the plurality of memory cell strings MS may include a plurality of memory cells MC1, MC2, . . . , MCn-1, and MCn, at least one string select transistor SST, and a ground select transistor GST, which are connected in series to each other. The plurality of memory cells MC1, MC2, . . . , MCn-1, and MCn may store data, and the plurality of word lines WL1, WL2, WLn-1, and WLn may be respectively connected to memory cells MC1, MC2, . . . , MCn-1, and MCn to control the corresponding memory cells MC1, MC2, MCn-1, and MCn.

A gate terminal of a ground selection transistor GST of the memory cell strings MS may be connected to a ground selection line GSL, and a source terminal of the ground selection transistor GST may be connected to a common source line CSL. Gate terminals of the string selection transistors SST may be connected to string selection lines SSL, a source terminal of the lowermost string selection transistor SST may be connected to a drain terminal of the memory cell MCn, and a drain terminal of the uppermost string selection transistor SST may be connected to a respective one of a plurality of bit lines BL1, BL2, BLm (i.e., BL). Although FIG. 1 exemplarily illustrates that each memory cell strings MS includes one ground selection transistor GST and two string selection transistors SST, unlike this case, a plurality of for example one or more than three ground selection transistors GST and string selection transistors SST may be formed in each memory cell strings MS. That is, each of the memory cell strings MS may include one or more ground selection transistors GST and one or more string selection transistors SST.

When a signal is applied to the gate terminal of the string selection transistor SST via the string selection line SSL, signals applied via the plurality of bit lines BL may be applied to the plurality of memory cells MC1, MC2, . . . , MCn-1, and MCn to perform a data write operation. When a signal is applied to the gate terminal of the ground selection transistor GST via the ground selection line GSL, an erase operation of the plurality of memory cells MC1, MC2, . . . , MCn-1, and MCn may be performed.

Figure 2:
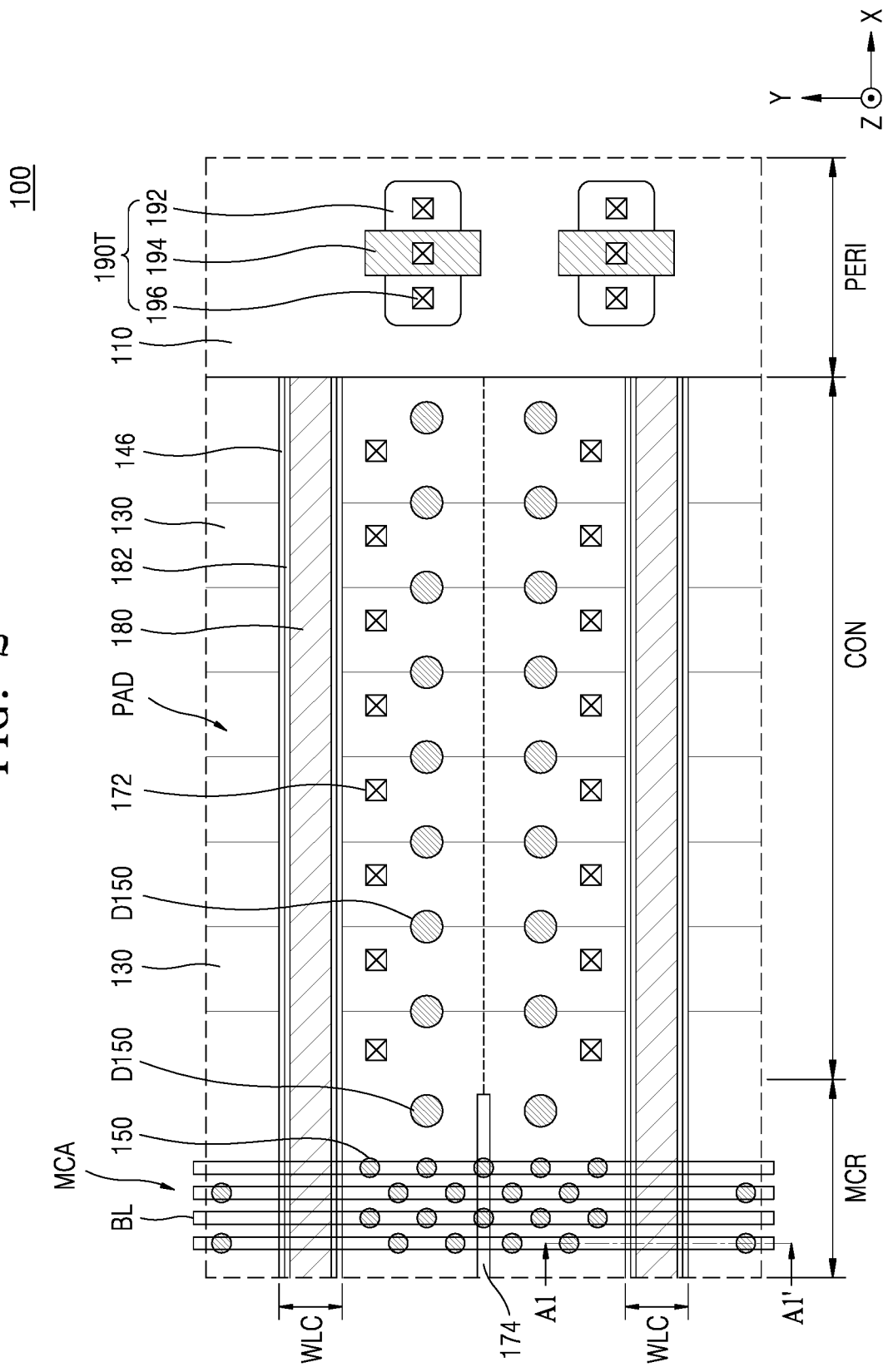
FIG. 2 illustrates a plan view of a representative configuration of a semiconductor device according to example embodiments of the inventive concepts.
Figure 3:
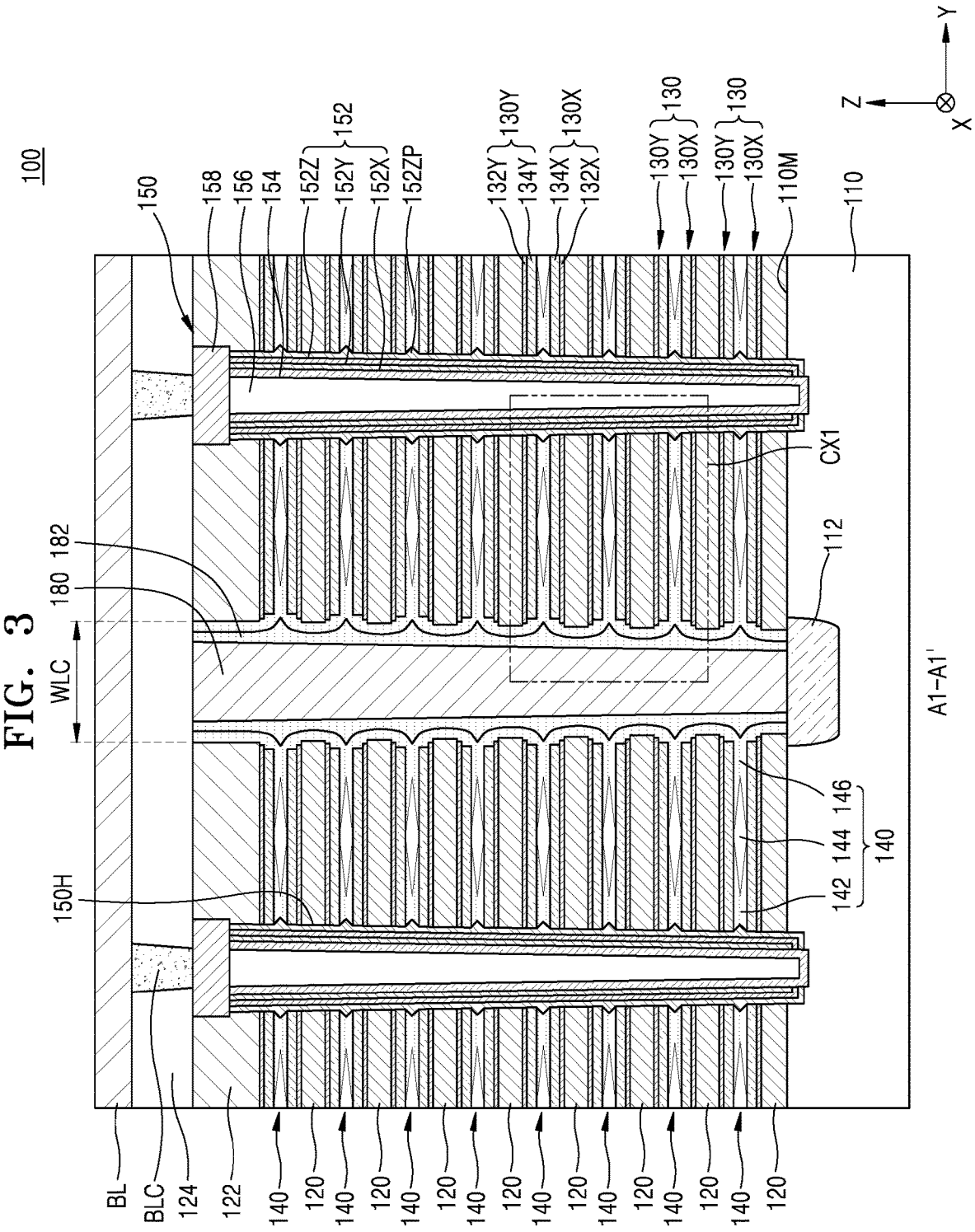
FIG. 3 illustrates a cross-sectional view taken along line A1-A1' in FIG. 2.
Figure 4:
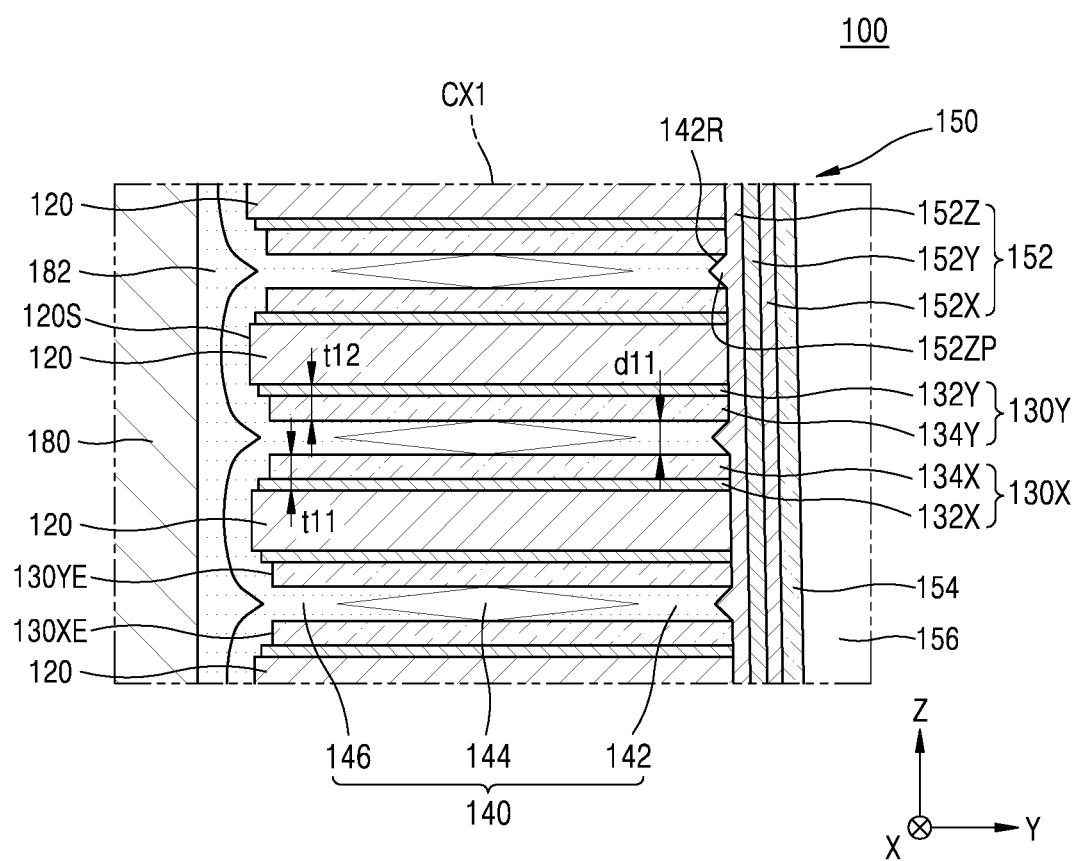
FIG. 4 illustrates an enlarged view of a region CX1 in FIG. 3.

FIG. 2 illustrates a plan view of a representative configuration of a semiconductor device 100, according to example embodiments of the inventive concepts. FIG. 3 illustrates a cross-sectional view taken along line A1-A1' in FIG. 2, and FIG. 4 illustrates an enlarged view of a region CX1 in FIG. 3. In FIG. 2, only some components of the semiconductor device 100 are schematically illustrated for convenience of illustration and understanding.

Referring to FIGS. 2 through 4, a substrate 110 may include a memory cell region MCR, a connection region CON, and a peripheral circuit region PERI. The memory cell array MCA may be on the memory cell region MCR, and the memory cell array MCA may include a NAND memory device having a vertical channel structure driven in the manner described above with reference to FIG. 1. A peripheral circuit transistor 190T for driving the memory cell array MCA may be on the peripheral circuit region PERI, and the peripheral circuit transistor 190T may include a peripheral circuit active region 192, a peripheral circuit gate electrode 194 on the peripheral circuit active region 192, and a peripheral circuit contacts 196 connected to the peripheral circuit active region 192 and the peripheral circuit gate electrode 194. The connection region CON may be an area in which a pad portion PAD for connecting the memory cell array MCA in the memory cell region MCR to the peripheral circuit transistor 190T is formed.

The substrate 110 may have a main surface 110M extending in a first direction (X direction) and a second direction (Y direction). The substrate 110 may include a semiconductor material such as for example a Group IV semiconductor, a Group III-V compound semiconductor, or a Group II-VI oxide semiconductor. For example, the Group IV semiconductor may include silicon (Si), germanium (Ge), or silicon-germanium. The substrate 110 may be provided as a bulk wafer or an epitaxial layer. In other embodiments, the substrate 110 may include a silicon-on-insulator (SOI) substrate or a germanium-on-insulator (GeOI) substrate.

On the memory cell region MCR of the substrate 110, a plurality of insulating layers 120 may extend in the first direction (X direction) and the second direction (Y direction) parallel with the main surface 110M of the substrate 110, and may be apart from each other in a third direction (Z direction) perpendicular to the main surface 110M of the substrate 110.

Each of a plurality of pairs of gate electrodes 130 may be between two adjacent insulating layers 120 among the plurality of insulating layers 120. Each pair of gate electrodes 130 may include a first gate electrode 130X and a second gate electrode 130Y apart from each other in a third direction (Z direction). For example, an insulating layer 120 may be on the main surface 110M of the substrate 110, a first gate electrode 130X and a second gate electrode 130Y (that is, one pair of gate electrodes 130) may be on the insulating layer 120, and another insulating layer 120 may be on the second gate electrode 130Y. A first top insulating layer 122 may be on an uppermost pair of gate electrodes 130.

The first gate electrode 130X may include a first conductive barrier layer 132X and a first metal layer 134X that are sequentially arranged above a top surface of the insulating layer 120 disposed below. The second gate electrode 130Y may include a second conductive barrier layer 132Y and a second metal layer 134Y that are sequentially arranged on a bottom surface of the insulating layer 120 disposed above. For example, the first conductive barrier layer 132X and the first metal layer 134X may be on the top surface of a lower insulating layer 120 among the two adjacent insulating layers 120, and the second conductive barrier layer 132Y and the second metal layer 134Y may be on the bottom surface of an upper insulating layer 120 among the two adjacent insulating layers 120. For example, the first metal layer 134X may face the second metal layer 134Y between two adjacent insulating layers 120, the first conductive barrier layer 132X may be between the lower insulating layer 120 among the two adjacent insulating layers 120 and the first metal layer 134X, and the second conductive barrier layer 132Y may be between the upper insulating layer 120 among the two adjacent insulating layers 120 and the second metal layer 134Y.

In example embodiments, the first conductive barrier layer 132X and the second conductive barrier layer 132Y may for example include titanium nitride (TiN), tantalum nitride (TaN), tungsten nitride (WN), ruthenium (Ru), titanium (Ti), tantalum (Ta), or a combination thereof. The first metal layer 134X and the second metal layer 134Y may for example include at least one of cobalt (Co), tungsten (W), nickel (Ni), ruthenium (Ru), copper (Cu), aluminum (Al), a silicide thereof, and an alloy thereof.

In example embodiments, the first gate electrode 130X may have a first thickness t11 of about 1 to about 30 nm in the third direction (Z direction), and the second gate electrode 130Y may have a second thickness t12 of about 1 to about 30 nm in the third direction (Z direction). However, the first thickness t11 and the second thickness t12 of the first gate electrode 130X and the second gate electrode 130Y are not limited thereto, respectively.

In example embodiments, the plurality of pairs of gate electrodes 130 may correspond to the ground selection line GSL, the word lines WL1, WL2, . . . , WLn−1, and WLn, and the string selection line SSL. For example, the lowermost first gate electrode 130X may function as the ground selection line GSL, the uppermost second gate electrode 130Y may function as the string selection line SSL, and the remaining first gate electrodes 130X and the remaining second gate electrodes 130Y may function as the word lines WL1, WL2, . . . , WLn−1, and WLn. In some embodiments, the uppermost first gate electrode 130X arranged directly under the uppermost second gate electrode 130Y may function as a dummy word line. In other embodiments, the lowermost pair of gate electrodes 130 (for example, the lowermost first gate electrode 130X and the lowermost second gate electrode 130Y) may function as the ground selection line GSL, the uppermost pair of gate electrodes 130 (for example, the uppermost first gate electrode 130X and the uppermost second gate electrode 130Y) may function as the string selection line SSL, and the remaining pairs of gate electrodes 130 may function as the word lines WL1, WL2, . . . , WLn−1, and WLn). Accordingly, the memory cell string MS in which the ground selection transistor GST, the string selection transistor SST, and the memory cells MC1, MC2, . . . , MCn−1, and MCn therebetween are connected in series may be provided.

As illustrated in FIG. 2, a plurality of word line cut regions WLC may extend in parallel with the main surface 110M of the substrate 110 in the first direction (X direction). The plurality of pairs of gate electrodes 130 between a pair of word line cut regions WLC may constitute one block, and the pair of word line cut regions WLC may define a width in the second direction (Y direction) of the plurality of pairs of gate electrodes 130.

A plurality of channel structures 150 may extend in the vertical direction (Z direction) passing through the plurality of pairs of gate electrodes 130 from the main surface 110M of the substrate 110 in the memory cell region MCR. The plurality of channel structures 150 may be apart from each other at certain intervals in the first direction (X direction), the second direction (Y direction), and a fourth direction (for example, a diagonal direction). The plurality of channel structures 150 may be in a zigzag shape or staggered shape.

Each of the plurality of channel structures 150 may be inside a channel hole 150H passing through the plurality of pairs of gate electrodes 130, the insulating layers 120, and the first top insulating layer 122. A gate insulating layer 152 and a channel layer 154 may be sequentially arranged on an inner wall of the channel hole 150H, and a filling insulating layer 156 filling a remaining space of the channel hole 150H may be arranged on the channel layer 154. A conductive plug 158 contacting the channel layer 154 and blocking an entrance of the channel hole 150H may be arranged on a top side of the channel hole 150H. In other embodiments, the filling insulating layer 156 may be omitted, and the channel layer 154 may be formed in a pillar shape to fill the remaining portion of the channel hole 150H.

The gate insulating layer 152 may have a structure including a tunneling dielectric layer 152X, a charge storage layer 152Y, and a blocking dielectric layer 152Z that are sequentially formed on sidewalls of the channel layer 154. In other words, the blocking dielectric layer 152Z, the charge storage layer 152Y, and the tunneling dielectric layer 152X may be sequentially arranged on the inner wall of the channel hole 150H. Relative thicknesses of the tunneling dielectric layer 152X, the charge storage layer 152Y, and the blocking dielectric layer 152Z that constitute the gate insulating layer 152 are not limited to those illustrated in FIG. 4 and may be variously modified.

The tunneling dielectric layer 152X may include for example silicon oxide, hafnium oxide, aluminum oxide, zirconium oxide, tantalum oxide, etc. The charge storage layer 152Y may be an area in which electrons having passed through the tunneling dielectric layer 152X from the channel layer 154 are stored and may include for example silicon nitride, boron nitride, silicon boron nitride, or polysilicon doped with impurities. The blocking dielectric layer 152Z may include for example silicon oxide, silicon nitride, or a metal oxide having a higher dielectric constant than silicon oxide. The metal oxide may include for example hafnium oxide, aluminum oxide, zirconium oxide, tantalum oxide, or a combination thereof.

The first gate electrode 130X of each pair of gate electrodes 130 may be apart from the second gate electrode 130Y in the third direction (Z direction) by a cover insulating layer structure 140. The cover insulating layer structure 140 may include a first cover insulating layer 142, an air space 144, and a second cover insulating layer 146. The first cover insulating layer 142 may surround a sidewall of the channel structure 150, and the second cover insulating layer 146 may cover an edge portion 130XE of the first gate electrode 130X adjacent to the word line cut region WLC and an edge portion 130YE of the second gate electrode 130Y adjacent to the word line cut region WLC. The air space 144 may denote a space limited by the first cover insulating layer 142 and the second cover insulating layer 146 between the first gate electrode 130X and the second gate electrode 130Y.

For example, when the first cover insulating layer 142 is formed by using an insulating material having a poor step coverage, and then the second cover insulating layer 146 is formed by using an insulating material having a poor step coverage, a portion of the space between the first gate electrode 130X and the second gate electrode 130Y may remain unfilled by the first cover insulating layer 142 or the second cover insulating layer 146, and the remaining unfilled space may be referred to as the air space 144.

The first cover insulating layer 142 may surround a sidewall of the channel structure 150, and the first cover insulating layer 142 may contact a sidewall of the gate insulating layer 152. As illustrated in FIG. 4, the first cover insulating layer 142 may include a recess 142R, and a first protrusion 152ZP may be formed in a portion of the sidewall of the gate insulating layer 152 facing the recess 142R (for example, on a portion of the sidewall of the blocking dielectric layer 152Z). However, a shape and size of the recess 142R or a shape and size of the first protrusion 152ZP are not limited to those illustrated in FIG. 4.

In some embodiments, at least one of the plurality of first cover insulating layers 142 at different vertical levels may not include the recess 142R, and in this case, a portion of the gate insulating layer 152 contacting the first cover insulating layer 142 may have sidewalls extending substantially vertically. In some embodiments, at least one recess 142R of the plurality of first cover insulating layers 142 at different vertical levels may have greater depth than the recesses 142R of the remaining first cover insulating layers 142. The first protrusion 152ZP contacting the at least one recess 142R may further outwardly protrude with respect to the first protrusions 152ZP contacting the remaining recesses 142R.

As exemplarily illustrated in FIG. 4, the second cover insulating layer 146 may cover the edge portion 130XE of the first gate electrode 130X and the edge portion 130YE of the second gate electrode 130Y, and in addition, may cover a sidewall 120S of the insulating layer 120 adjacent to the word line cut region WLC. With respect to the sidewall 120S of the insulating layer 120 adjacent to the word line cut region WLC, the edge portion 130XE of the first gate electrode 130X may be inwardly recessed (for example, toward the channel structure 150). For example, a sidewall of the first conductive barrier layer 132X may be inwardly recessed with respect to the sidewall 120S of the insulating layer 120, and a sidewall of the first metal layer 134X may be inwardly recessed with respect to the sidewall 120S of the insulating layer 120 or the sidewall of the first conductive barrier layer 132X. As exemplarily illustrated in FIG. 4, the second cover insulating layer 146 may include a sidewall profile of a curved surface conforming to the sidewall 120S of the insulating layer 120, the sidewall of the first gate electrode 130X, and the sidewall of the second gate electrode 130Y. In other embodiments, unlike illustrated in FIG. 4, the second cover insulating layer 146 may have a planar sidewall profile substantially extending in the vertical direction.

A separation distance d11 between the first gate electrode 130X and the second gate electrode 130Y may be about 1 to about 30 nm, but is not limited thereto. As the first gate electrode 130X and the second gate electrode 130Y are arranged apart from each other in a space between two adjacent insulating layers 120, the first gate electrode 130X may have a relatively small first thickness t11 in the third direction (Z direction), the second gate electrode 130Y may have a relatively small second thickness t12 in the third direction (Z direction), and the separation distance d11 between the first gate electrode 130X and the second gate electrode 130Y may also be relatively small.

On the substrate 110, a plurality of common source lines 180 vertically overlapping the plurality of word line cut regions WLC may be arranged in the first direction (X direction). Insulating spacers 182 may be on both sidewalls of the plurality of common source lines 180. For example, the second cover insulating layer 146 and the insulating spacer 182 may be between the plurality of pairs of gate electrodes 130 and the common source line 180. The plurality of common source lines 180 are illustrated as having a bottom surface at the same level as the main surface 110M of the substrate 110 in FIG. 3, but in other embodiments the plurality of common source lines 180 may extend to a level lower than the main surface 110M of the substrate 110.

A plurality of common source regions 112 may be in the substrate 110 under the common source line 180 and may extend in the first direction (X direction). The plurality of common source regions 112 may be impurity regions including n-type impurities heavily doped thereon. The plurality of common source regions 112 may function as a source region for supplying current to the plurality of memory cells MC1, MC2, ..., MCn−1, and MCn. The plurality of common source regions 112 may be at positions where the plurality of common source regions 112 overlap the plurality of word line cut regions WLC.

A second top insulating layer 124 may be on the first top insulating layer 122, and the bit line BL may extend in the second direction (Y direction) on the second top insulating layer 124. A bit line contact BLC may be between the bit line BL and the conductive plug 158, and the second top insulating layer 124 may surround the bit line contact BLC.

As illustrated in FIG. 2, in one block, an uppermost pair of gate electrodes 130 may be separated into two portions by a string separation insulating layer 174, in a plan view. Although not illustrated, the string separation insulating layer 174 may extend from the same level as the top surface of the first top insulating layer 122 to a level lower than a bottom surface of the uppermost pair of gate electrodes 130.

In the connection region CON, the plurality of pairs of gate electrodes 130 may extend to form the pad portion PAD. The plurality of pairs of gate electrodes 130 may extend to have a shorter length in the first direction (X direction) as a vertical distance of the plurality of pairs of gate electrodes 130 from the main surface 110M of the substrate 110 increases. The pad portion PAD may refer to portions of the plurality of pairs of gate electrodes 130 that are configured in a step shape. The second top insulating layer 124 may be above the plurality of pairs of gate electrodes 130 constituting the pad portion PAD, and a pad contact 172, which passes through the second top insulating layer 124 and is connected to the plurality of pairs of gate electrodes 130, may be arranged in the connection region CON.

As illustrated in FIG. 2, a plurality of dummy channel structures D150 may pass through the plurality of pairs of gate electrodes 130 from the main surface 110M of the substrate 110 and extend in the third direction (Z direction) in the connection region CON. The dummy channel structure D150 may be formed to secure structural stability of the semiconductor device 100 in the fabrication process of the semiconductor device 100. Each of the plurality of dummy channel structures D150 may have the same structure as the channel structure 150. The plurality of dummy channel structures D150 may have a greater width than the channel structures 150, but is not limited thereto.

In general, as the degree of integration of semiconductor devices increases, a vertical height of semiconductor devices may increase, and due to a relatively large vertical height of a mold stack of the semiconductor devices, defects such as collapsing or falling of the mold stack may occur during a process of removing a sacrificial layer for forming a gate electrode.

However, according to the semiconductor device 100 of embodiments of the inventive concepts, as an example, in a gate space GS (refer to FIG. 15) from which one sacrificial layer 310 (refer to FIG. 14) has been removed, that is, in the space between two adjacent insulating layers 120, a pair of gate electrodes 130 including the first gate electrode 130X and the second gate electrode 130Y apart from each other may be formed. Accordingly, the first gate electrode 130X and the second gate electrode 130Y may have relatively small thicknesses t11 and t12, respectively, and the separation distance d11 between the first gate electrode 130X and the second gate electrode 130Y may be relatively small. Thus, the vertical height of the semiconductor device 100 may be relatively reduced, and the occurrence of defects due to collapsing or falling of mold stacks during the fabrication process of the semiconductor device 100 may be reduced or prevented.

Figure 5:
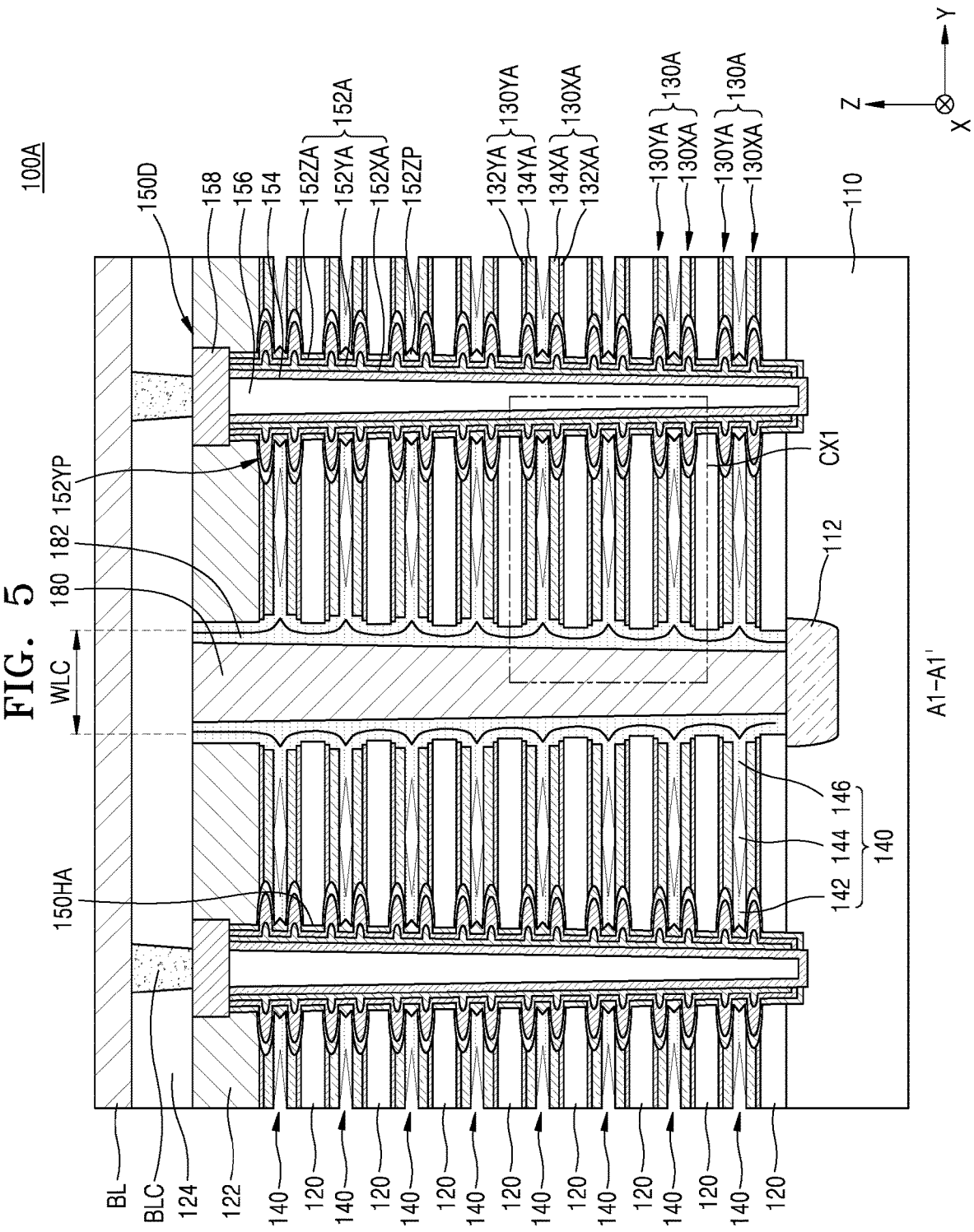
FIG. 5 illustrates a cross-sectional view of a semiconductor device according to example embodiments of the inventive concepts.
Figure 6:
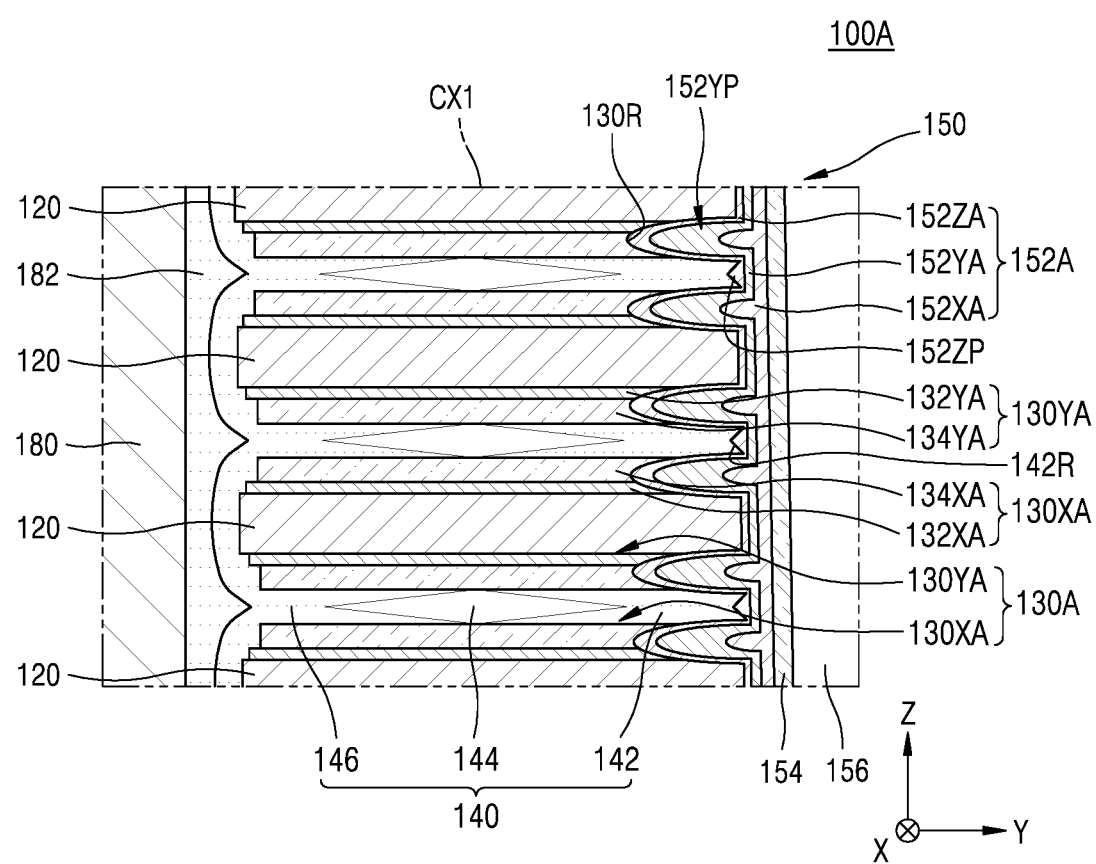
FIG. 6 illustrates an enlarged cross-sectional view of a region CX1 in FIG. 5.

FIG. 5 illustrates a cross-sectional view of a semiconductor device 100A according to example embodiments of the inventive concepts, and FIG. 6 illustrates an enlarged cross-sectional view of a region CX1 in FIG. 5. In FIGS. 5 and 6, similar reference numbers to those in FIGS. 1 through 4 may denote similar components, and description of features in FIGS. 5 and 6 that are similar to features in FIGS. 1 through 4 may be omitted from the following for brevity.

Referring to FIGS. 5 and 6, the semiconductor device 100A may include a plurality of pairs of gate electrodes 130A, and the plurality of pairs of gate electrodes 130A may include a recess region 130R formed on sidewalls facing the channel structure 150. In addition, the first cover insulating layer 142 may include the recess 142R, and a gate insulating layer 152A may include the first protrusion 152ZP on a sidewall portion that contacts the recess 142R of the first cover insulating layer 142 and a second protrusion 152YP on a sidewall portion that contacts the recess region 130R of the plurality of pairs of gate electrodes 130A. The second protrusion 152YP may protrude more outwardly (for example, in a direction toward the word line cut region WLC) than the first protrusion 152ZP.

In example embodiments, as the gate electrode 130A includes the recess region 130R, a distance between the gate electrode 130A and the channel layer 154 may be greater than a distance between the gate electrode 130 and the channel layer 154 of the semiconductor device 100 described with reference to FIGS. 2 through 4.

The gate insulating layer 152A may include a tunneling dielectric layer 152XA, a charge storage layer 152YA, and a blocking dielectric layer 152ZA, and the charge storage layer 152YA and the blocking dielectric layer 152ZA may be arranged in the second protrusion 152YP. As the charge storage layer 152YA is arranged in the second protrusion 152YP, a separation distance from the channel layer 154 to the charge storage layer 152YA may be relatively large, and accordingly, a charge transfer path from the channel layer 154 to the charge storage layer 152YA may be relatively long. Thus, data loss due to a phenomenon that the charge stored in the charge storage layer 152YA of one memory cell is spread to a portion of the charge storage layer 152YA of an adjacent memory cell (that is, in the same direction as the extension direction of the channel layer 154) may be prevented.

In the fabrication process according to the example embodiments, the recess region 130R may be formed by removing a portion of a preliminary conductive barrier layer 132L (refer to FIG. 27) and a portion of a preliminary metal layer 134L (refer to FIG. 27) which are exposed at an inner wall of the channel hole 150HA in a lateral direction (a horizontal direction). Next, the gate insulating layer 152A may be formed on the inner wall of the channel hole 150HA, and then, the second protrusion 152YP of the gate insulating layer 152A may be formed in the recess region 130R.

According to the semiconductor device 100A of embodiments of the inventive concepts, as an example, in the gate space GS (refer to FIG. 15) from which one sacrificial layer 310 (refer to FIG. 14) has been removed, that is, in the space between two adjacent insulating layers 120, a pair of gate electrodes 130 including the first gate electrode 130X and the second gate electrode 130Y apart from each other may be formed. Thus, the vertical height of the semiconductor device 100A may be relatively reduced, and an occurrence of defects due to collapsing or falling of the mold stack during the fabrication process of the semiconductor device 100A may be reduced or prevented. In addition, since the gate insulating layer 152A includes the second protrusion 152YP, data loss may be prevented, and reliability of the semiconductor device 100A may be improved.

Figure 7:
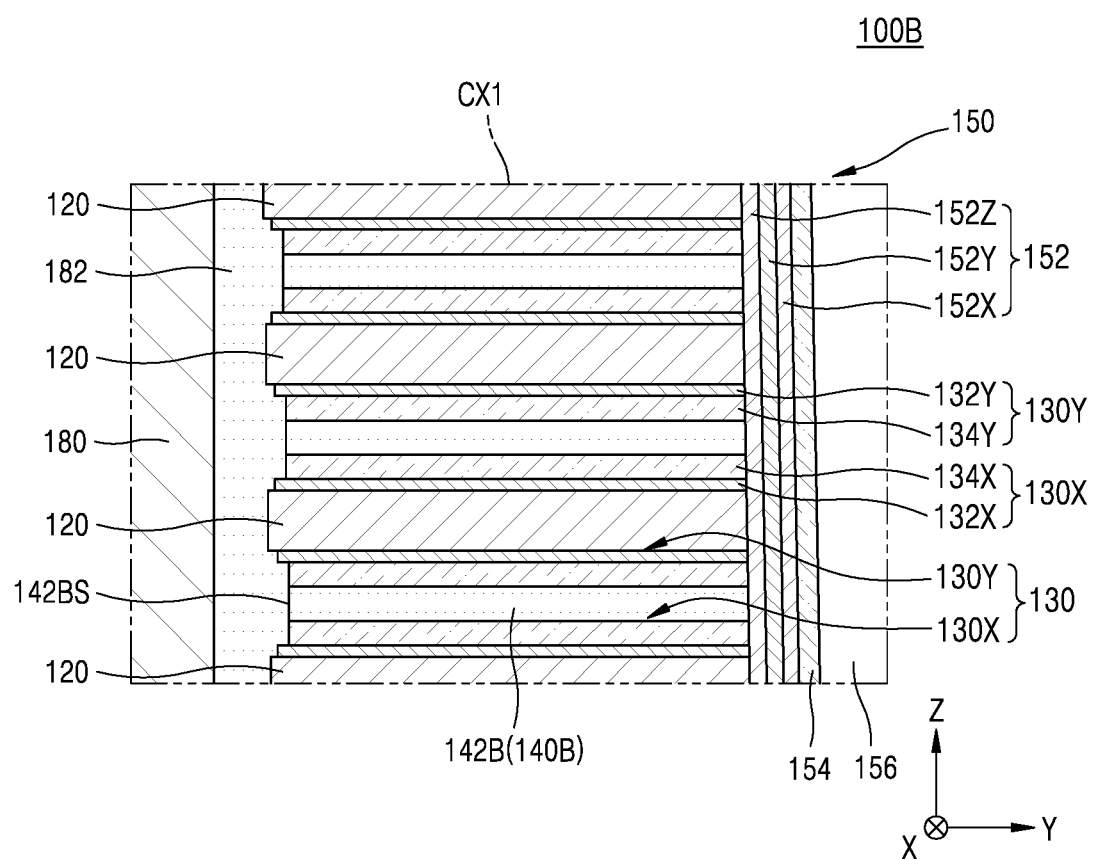
FIG. 7 illustrates a cross-sectional view of a semiconductor device according to example embodiments of the inventive concepts.

FIG. 7 illustrates a cross-sectional view of a semiconductor device 100B according to example embodiments of the inventive concepts. In FIG. 7, the same reference numerals as those in FIGS. 1 through 6 may denote the same components, and description of features in FIG. 7 that are similar to features in FIGS. 1 through 6 may be omitted from the following for brevity.

Referring to FIG. 7, a cover insulating layer structure 140B may be between the first gate electrode 130X and the second gate electrode 130Y, and the cover insulating layer structure 140B may include a cover insulating layer 142B substantially filling the entire space between the first gate electrode 130X and the second gate electrode 130Y. A top surface of the cover insulating layer 142B may contact a bottom surface of the second metal layer 134Y, and a bottom surface of the cover insulating layer 142B may contact a top surface of the first metal layer 134X. A sidewall 142BS of the cover insulating layer 142B adjacent to the word line cut region WLC may be aligned with sidewalls of the first metal layer 134X and the second metal layer 134Y, as illustrated in FIG. 7. In other embodiments, the sidewall 142BS of the cover insulating layer 142B adjacent the word line cut region WLC may be inwardly recessed (for example, in a direction toward the channel structure 150) with respect to the sidewalls of the first metal layer 134X and the second metal layer 134Y. In other embodiments, the sidewall 142BS of the cover insulating layer 142B adjacent to the word line cut region WLC may outwardly protrude (for example, in a direction toward the common source line 180) with respect to the sidewalls of the first metal layer 134X and the second metal layer 134Y.

In example embodiments, the cover insulating layer 142B may include a low-k insulation material. For example, the low-k insulation material may include fluorosilicate glass (FSG), carbon doped silicon oxide (SIOC), a spin-on dielectric (SOD) material, or an ultra-low-k (ULK) material. For example, the cover insulating layer 142B may be formed by an atomic layer deposition process or a chemical vapor deposition process using the low-k insulation material. In other embodiments, the cover insulating layer 142B may include for example silicon oxide, silicon oxynitride, silicon nitride, etc.

In a process according to the example embodiments, the sacrificial layer 310 (refer to FIG. 14) may be removed through the channel hole 150H, the preliminary conductive barrier layer 132L (refer to FIG. 16) and the preliminary metal layer 134L (refer to FIG. 16) may be conformally formed on an inner wall of the gate space GS (refer to FIG. 15) in which the sacrificial layer 310 has been removed, and the cover insulating layer 142B may be formed to entirely fill the remaining inside of the gate space GS. In this case, the semiconductor device 100B described with reference to FIG. 7 may be formed.

According to the semiconductor device 100B of embodiments of the inventive concepts, as an example, in the gate space GS in which sacrificial layer 310 has been removed, that is, in a space between two adjacent insulating layers 120, a pair of gate electrodes 130 including the first gate electrode 130X and the second gate electrode 130Y apart from each other may be formed. Thus, the vertical height of the semiconductor device 100B may be relatively reduced, and the occurrence of defects due to collapsing or falling of the mold stack during the fabrication process of the semiconductor device 100B may be reduced or prevented.

Figure 8:
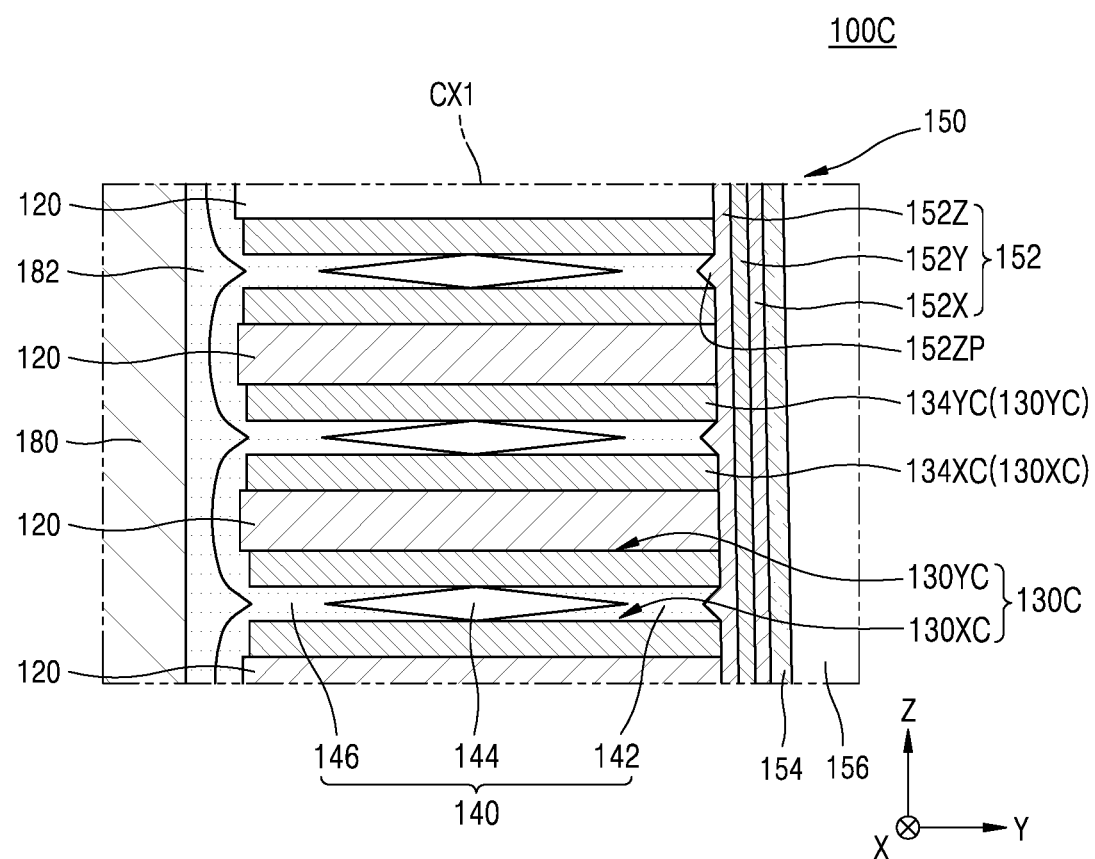
FIG. 8 illustrates a cross-sectional view of a semiconductor device according to example embodiments of the inventive concepts.

FIG. 8 illustrates a cross-sectional view of a semiconductor device 100C according to example embodiments of the inventive concepts. In FIG. 8, the same reference numerals as those in FIGS. 1 through 7 may denote the same components, and description of features in FIG. 7 that are similar to features in FIGS. 1 through 7 may be omitted from the following for brevity.

Referring to FIG. 8, a first gate electrode 130XC may include a first metal layer 134XC, and a second gate electrode 130YC may include a second metal layer 134YC. In other words, in the semiconductor device 100C, the first conductive barrier layer 132X and the second conductive barrier layer 132Y included in the semiconductor device 100 described with reference to FIGS. 2 through 4 may be omitted. A top surface of the first metal layer 134XC may contact the cover insulating layer structure 140, and a bottom surface of the first metal layer 134XC may contact the top surface of an insulating layer 120 below it. In addition, a top surface of the second metal layer 134YC may contact the bottom surface of the insulating layer 120 above it, and a bottom surface of the second metal layer 134YC may contact the cover insulating layer structure 140.

In example embodiments, the first metal layer 134XC and the second metal layer 134YC may include any one of titanium nitride (TiN), tantalum nitride (TaN), tungsten nitride (WN), ruthenium (Ru), titanium (Ti), tantalum (Ta), cobalt (Co), tungsten (W), nickel (Ni), copper (Cu), aluminum (Al), a silicide thereof, and an alloy thereof.

In a process according to example embodiments, the sacrificial layer 310 (refer to FIG. 14) may be removed through the channel hole 150H (refer to FIG. 14), and the preliminary metal layer 134L (refer to FIG. 16) may be conformally formed on the inner wall of the gate space GS in which the sacrificial layer 310 has been removed. In this case, the semiconductor device 100C described with reference to FIG. 8 may be formed.

According to the semiconductor device 100C of embodiments of the inventive concepts, as an example, in the gate space GS in which one sacrificial layer 310 has been removed, that is, in a space between two adjacent insulating layers 120, a pair of gate electrodes 130C including the first gate electrode 130XC and the second gate electrode 130YC apart from each other may be formed. Thus, the vertical height of the semiconductor device 100C may be relatively reduced, and the occurrence of defects due to collapsing or falling of the mold stack during the fabrication process of the semiconductor device 100C may be reduced or prevented.

Figure 9:
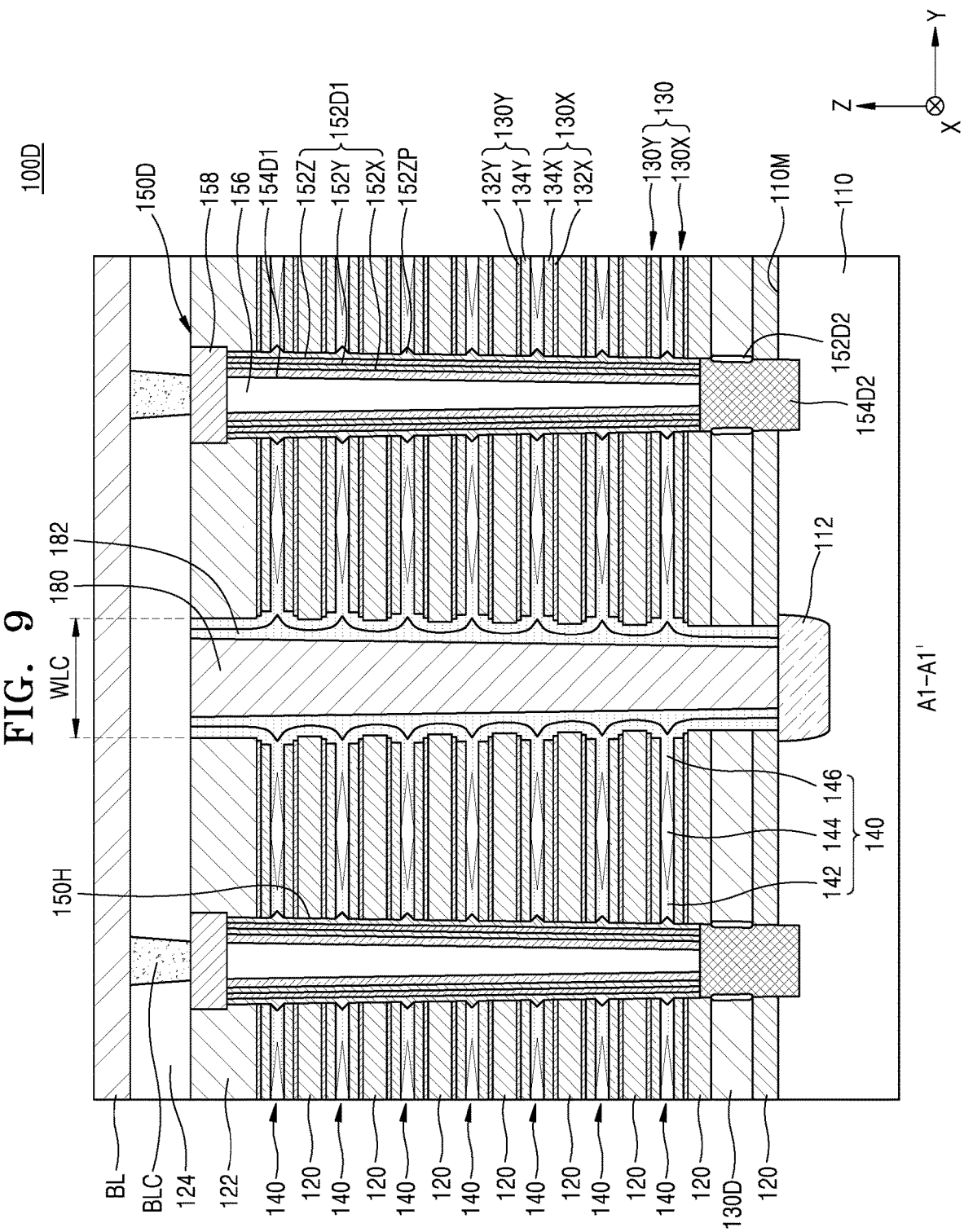
FIG. 9 illustrates a cross-sectional view of a semiconductor device according to example embodiments of the inventive concepts.

FIG. 9 illustrates a cross-sectional view of a semiconductor device 100D according to example embodiments. In FIG. 9, the same reference numerals as those in FIGS. 1 through 8 may denote the same components, and description of features in FIG. 9 that are similar to features in FIGS. 1 through 8 may be omitted from the following for brevity.

Referring to FIG. 9, a bottom gate electrode 130D may be between two lowermost insulating layers 120. The bottom gate electrode 130D may substantially fill an entire space between the lowermost two insulating layers 120, and the bottom gate electrode 130D may have a thickness greater than that of each of the first gate electrode 130X and the second gate electrode 130Y included in the pair of gate electrodes 130.

A channel structure 150D may include a first gate insulating layer 152D1 on a sidewall of the channel hole 150H, a first channel layer 154D1 on the sidewall of the channel hole 150H, a second channel layer 154D2 at a bottom portion of the channel hole 150H, a second gate insulating layer 152D2 between a sidewall of the second channel layer 154D2 and the bottom gate electrode 130D, the filling insulating layer 156, and the conductive plug 158. A top surface of the second channel layer 154D2 may be at a level higher than a top surface of the bottom gate electrode 130D. The second channel layer 154D2 may include a semiconductor layer formed by using a selective epitaxial growth process from the main surface 110M of the substrate 110 exposed at the bottom portion of the channel hole 150H. The second gate insulating layer 152D2 may include silicon oxide formed by a thermal oxidation process, but is not limited thereto. The first gate insulating layer 152D1 and the first channel layer 154D1 may be similar to the gate insulating layer 152 and the channel layer 154 described with reference to FIGS. 2 through 4, respectively.

Figure 10:
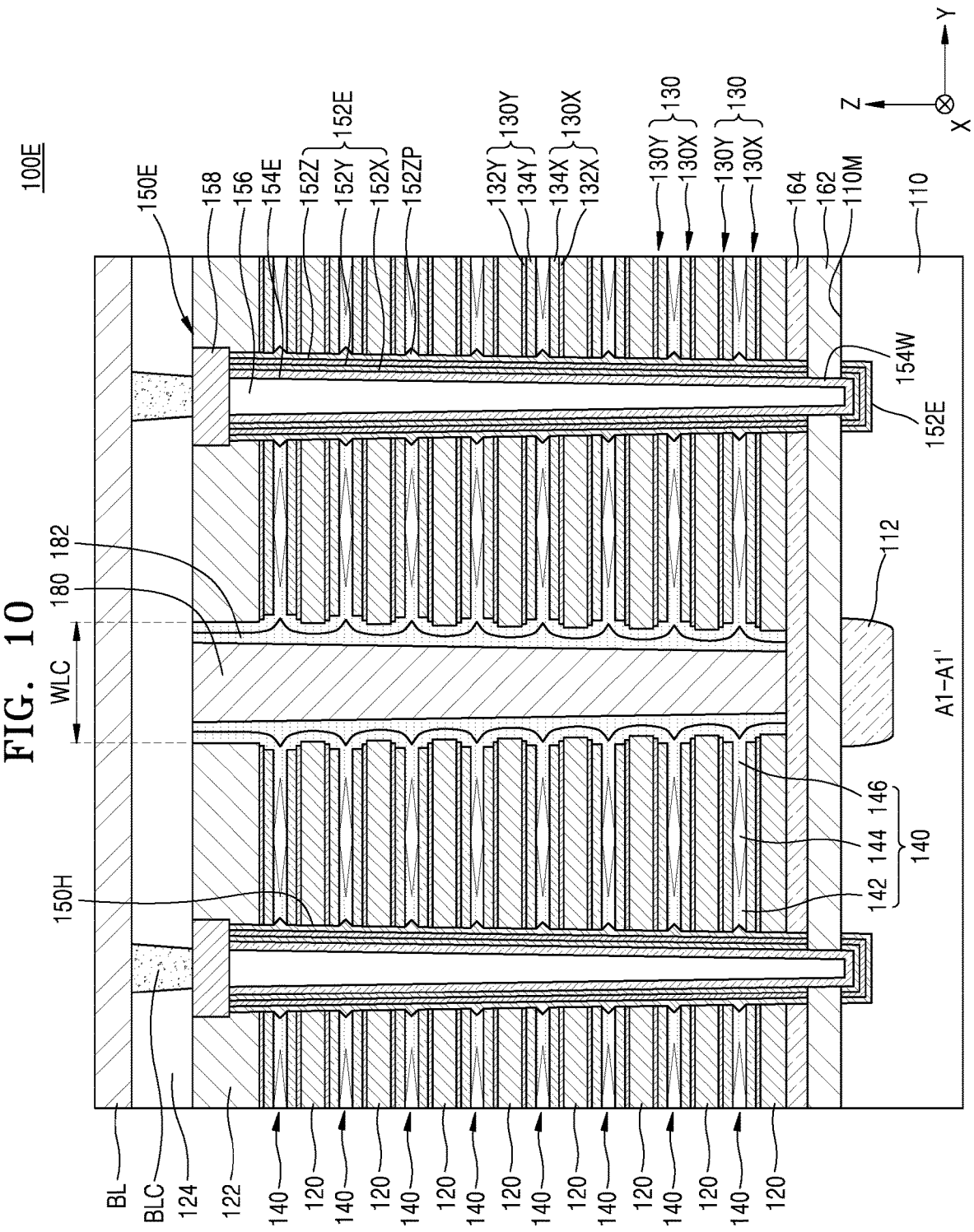
FIG. 10 illustrates a cross-sectional view of a semiconductor device according to example embodiments of the inventive concepts.

FIG. 10 illustrates a cross-sectional view of a semiconductor device 100E according to example embodiments of the inventive concepts. In FIG. 10, the same reference numerals as those in FIGS. 1 through 9 may denote the same components, and description of features in FIG. 10 that are similar to features in FIGS. 1 through 9 may be omitted from the following for brevity.

Referring to FIG. 10, the semiconductor device 100E may further include a first semiconductor layer 162 and a second semiconductor layer 164 sequentially arranged on the main surface 110M of the substrate 110, and the plurality of insulating layers 120 and the plurality of pairs of gate electrodes 130 may be alternately arranged on the second semiconductor layer 164. The first semiconductor layer 162 may include polysilicon doped with impurities or polysilicon undoped with impurities, and the second semiconductor layer 164 may also include polysilicon doped with impurities or polysilicon undoped with impurities. The first semiconductor layer 162 may function as a common source line extension region and may be a portion corresponding to the common source line CSL in FIG. 1. The second semiconductor layer 164 may function as a support layer to prevent a mold stack from collapsing or falling in the process of removing a sacrificial layer for forming the first semiconductor layer 162.

The channel structure 150E may pass through the first semiconductor layer 162 and the second semiconductor layer 164 and extend to a level lower than the main surface 110M of the substrate 110. A portion in which a gate insulation layer 152E is separated may be formed at a bottom of the channel structure 150E, and in the portion in which the gate insulation layer 152E is separated, a sidewall 154W of a channel layer 154E may be surrounded by the first semiconductor layer 162. In addition, a bottom surface of the channel layer 154E may be surrounded by the gate insulating layer 152E and may not contact the substrate 110, but the inventive concepts are not limited thereto.

Figure 11:
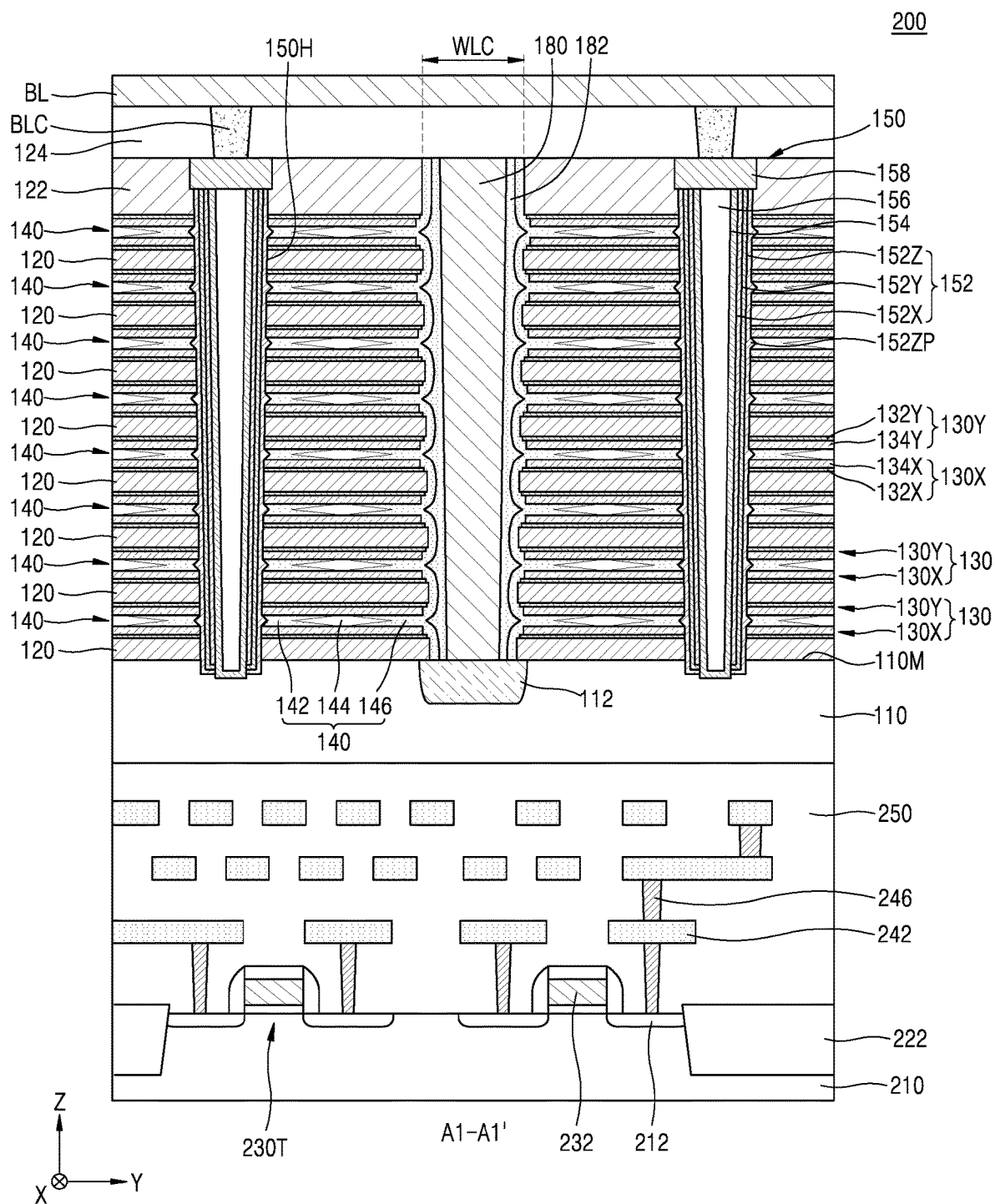
FIG. 11 illustrates a cross-sectional view of a semiconductor device according to example embodiments of the inventive concepts.

FIG. 11 illustrates a cross-sectional view of a semiconductor device 200 according to example embodiments of the inventive concepts. In FIG. 11, the same reference numerals as those in FIGS. 1 through 10 may denote the same components, and description of features in FIG. 11 that are similar to features in FIGS. 1 through 10 may be omitted from the following for brevity.

Referring to FIG. 11, a bottom substrate 210 may be at a lower vertical level than the substrate 110, and in the bottom substrate 110 an active region (not shown) may be defined by an isolation layer 222 in the bottom substrate 210, and on the active region a plurality of driving transistors 230T may be formed. The plurality of driving transistors 230T may include a driving circuit gate structure 232 and an impurity region 212 in a portion of the bottom substrate 210 on both sides of the driving circuit gate structure 232.

Over the bottom substrate 210, a plurality of wiring layers 242, a plurality of contact plugs 246 connecting each of the plurality of wiring layers 242 or connecting between the plurality of wiring layers 242 and the driving transistor 230T, and a bottom interlayer insulating layer 250 covering the plurality of wiring layers 242 and the plurality of contact plugs 246 may be arranged.

The substrate 110 may be on the bottom interlayer insulating layer 250. On the substrate 110, the plurality of insulating layers 120, the plurality of pairs of gate electrodes 130, the cover insulating layer structure 140, and the channel structure 150 may be arranged.

FIGS. 12 through 26 illustrate schematic diagrams of a fabrication method of the semiconductor device 100 according to a process sequence, according to example embodiments of the inventive concepts. FIGS. 12 through 26 are cross-sectional views corresponding to cross-sections along the line A1-A1' in FIG. 2. In FIGS. 12 through 26, the same reference numerals as those in FIGS. 1 through 11 may denote the same components.

Figure 12:
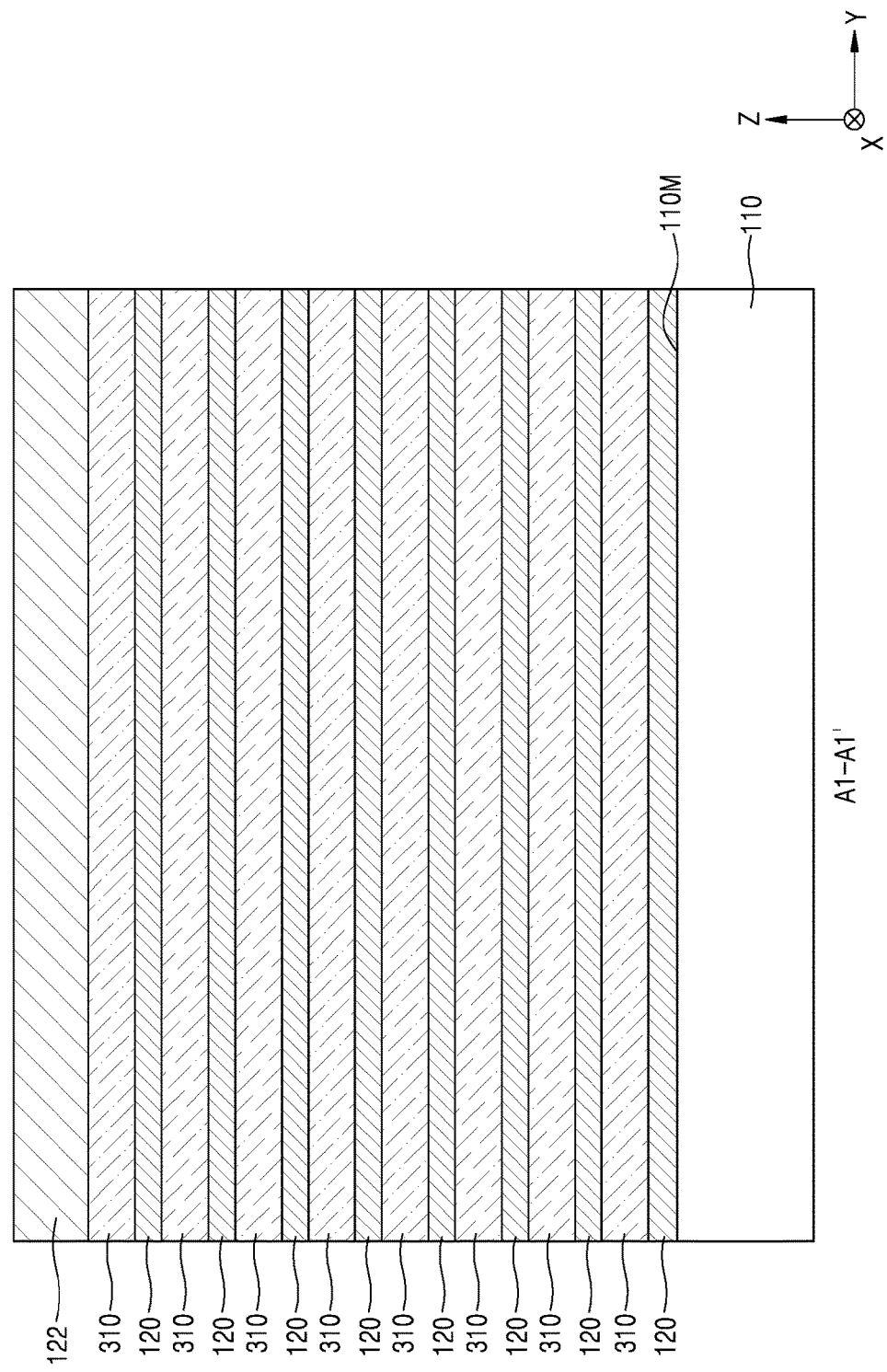
FIGS. 12, 13, 14, 15, 16, 17, 18, 19, 20, 21, 22, 23, 24, 25 and 26 illustrate schematic diagrams of a fabrication method of a semiconductor device according to a process sequence of example embodiments of the inventive concepts.

Referring to FIG. 12, the plurality of insulating layers 120 and a plurality of sacrificial layers 310 may be alternately formed on the main surface 110M of the substrate 110. In example embodiments, the plurality of insulating layers 120 may include an insulating material such as silicon oxide or silicon oxynitride, and the plurality of sacrificial layers 310 may include for example silicon nitride, silicon oxynitride, or polysilicon doped with impurities, etc.

Next, although not illustrated, the pad portion PAD (refer to FIG. 2) may be formed by sequentially patterning the plurality of insulating layers 120 and the plurality of sacrificial layers 310 in the connection region CON. In example embodiments, the pad portion PAD may be formed to have a step shape having a difference in top surface levels in the first direction (X direction) as described previously.

Next, the first top insulating layer 122 covering the uppermost sacrificial layer 310 and the pad portion PAD may be formed. The first top insulating layer 122 may include an insulating material such as silicon oxide and silicon oxynitride.

Figure 13:
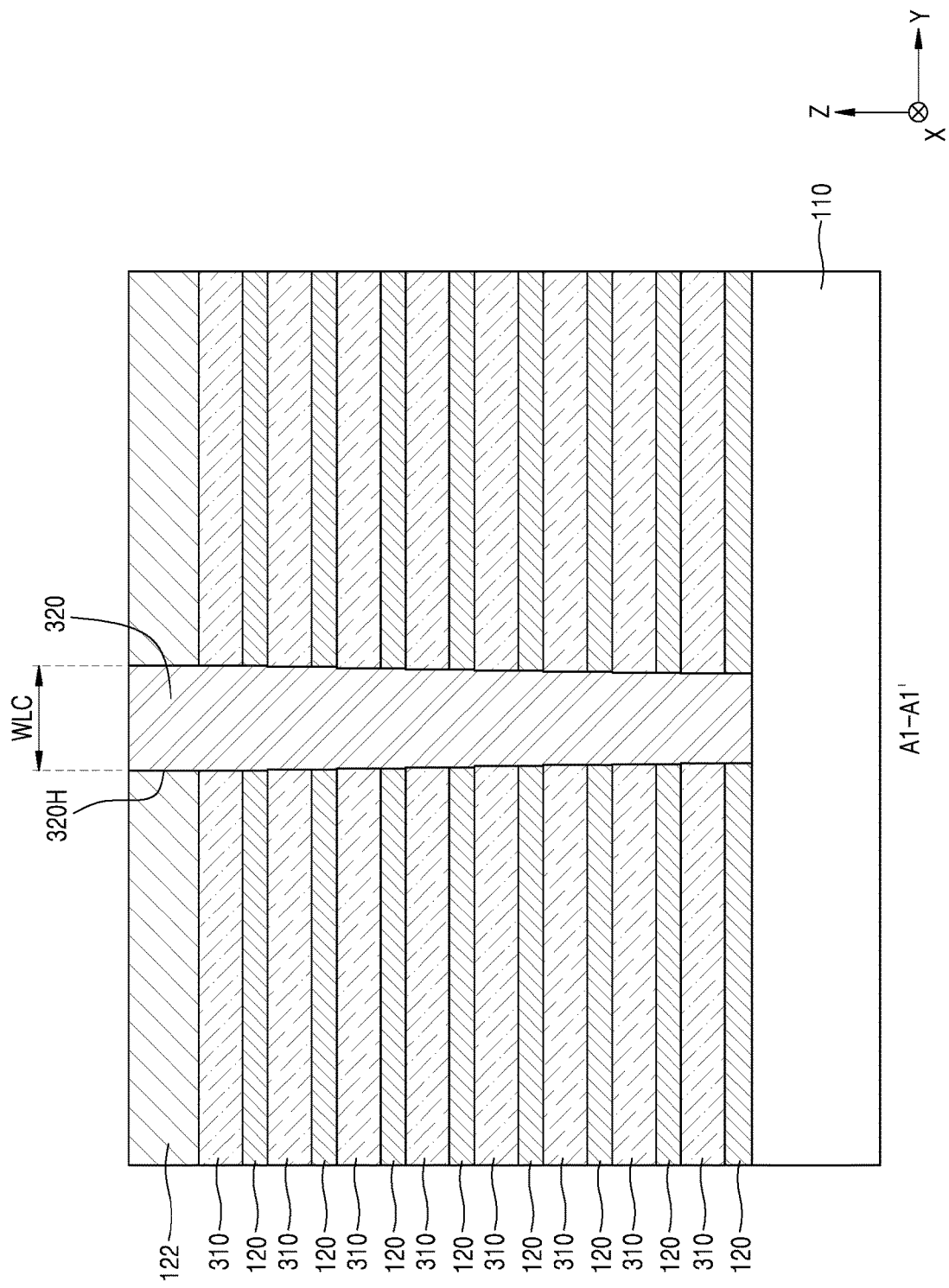

Referring to FIG. 13, a mask pattern (not illustrated) may be formed on the first top insulating layer 122, and a word line cut opening 320H may be formed by etching the first top insulating layer 122, the plurality of insulating layers 120, and a portion of the plurality of sacrificial layers 310 by using the mask pattern as an etching mask. Next, a word line cut insulating layer 320 may be formed by using an insulating material inside the word line cut opening 320H.

Figure 14:
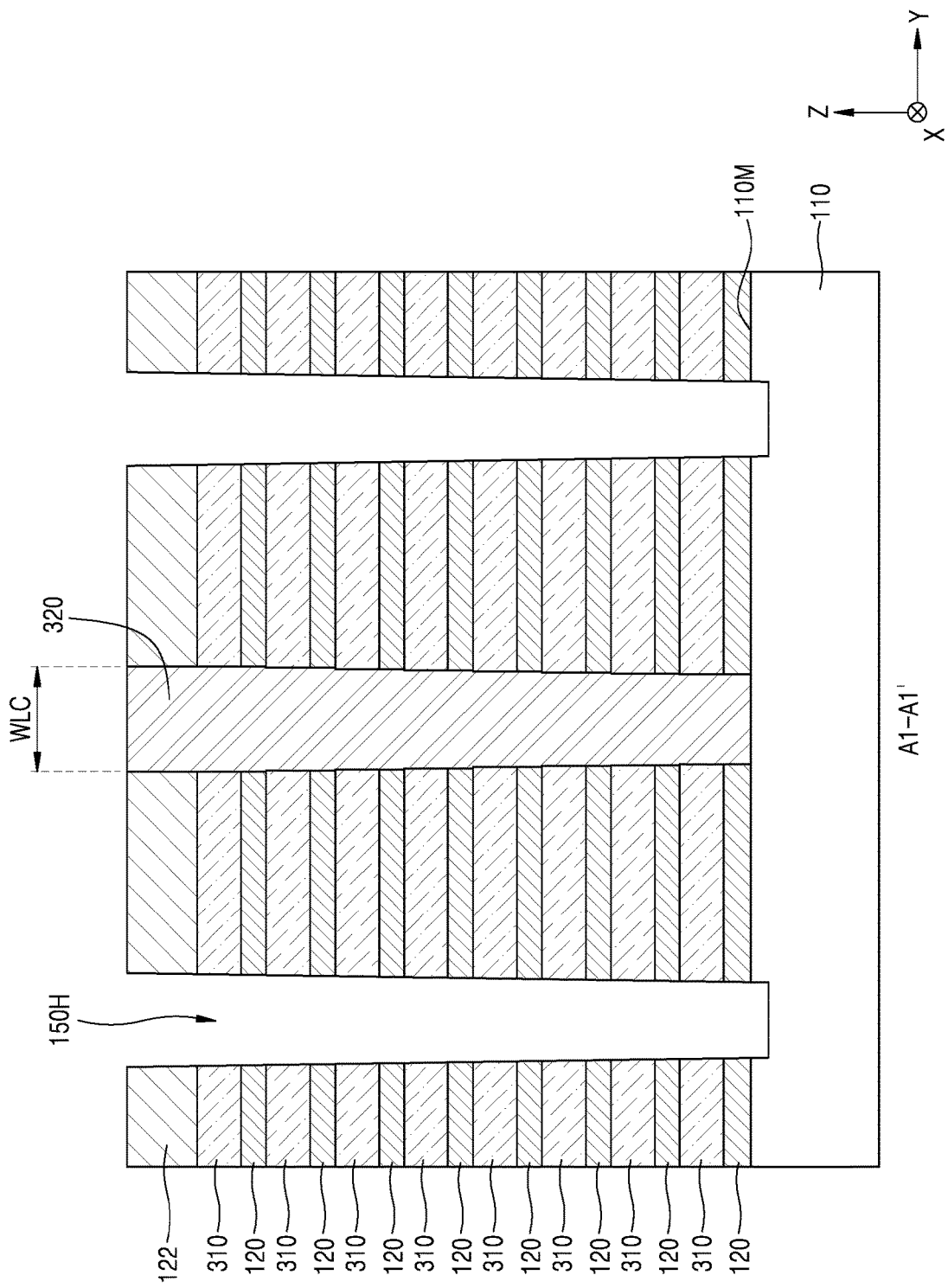

Referring to FIG. 14, the channel hole 150H may be formed by etching portions of the first top insulating layer 122, the plurality of insulating layers 120, and the plurality of sacrificial layers 310. The channel hole 150H may extend to a level lower than the main surface 110M of the substrate 110.

Figure 15:
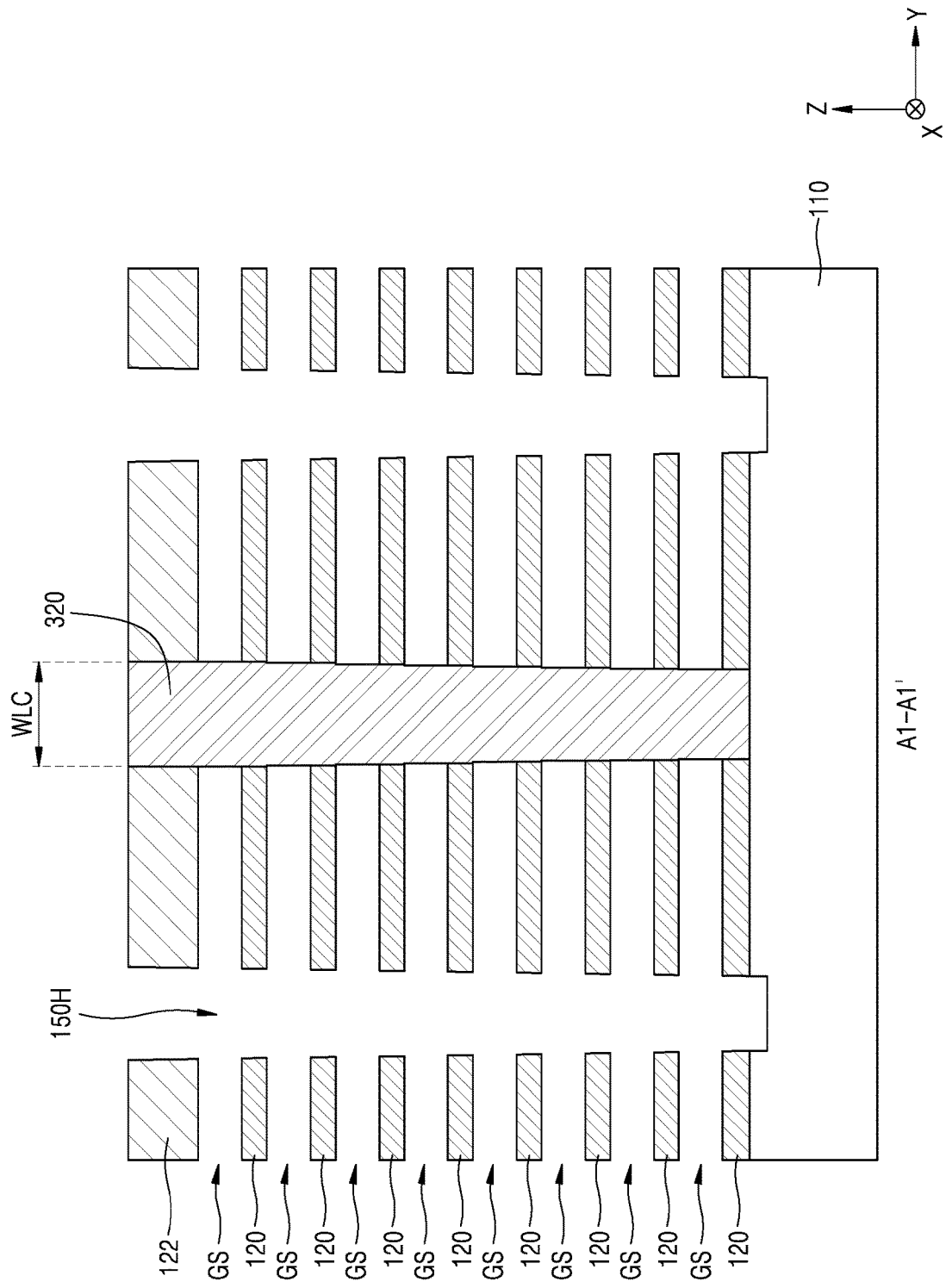

Referring to FIG. 15, by removing the plurality of sacrificial layers 310 exposed at the sidewall of the channel hole 150H, the plurality of gate spaces GS may be formed at positions where the plurality of sacrificial layers 310 have been removed. Sidewalls of the word line cut insulating layers 320 may be exposed in the plurality of gate spaces GS. In example embodiments, a removing process of the plurality of sacrificial layers 310 may be a wet etching process using a phosphoric acid solution as an etchant.

Figure 16:
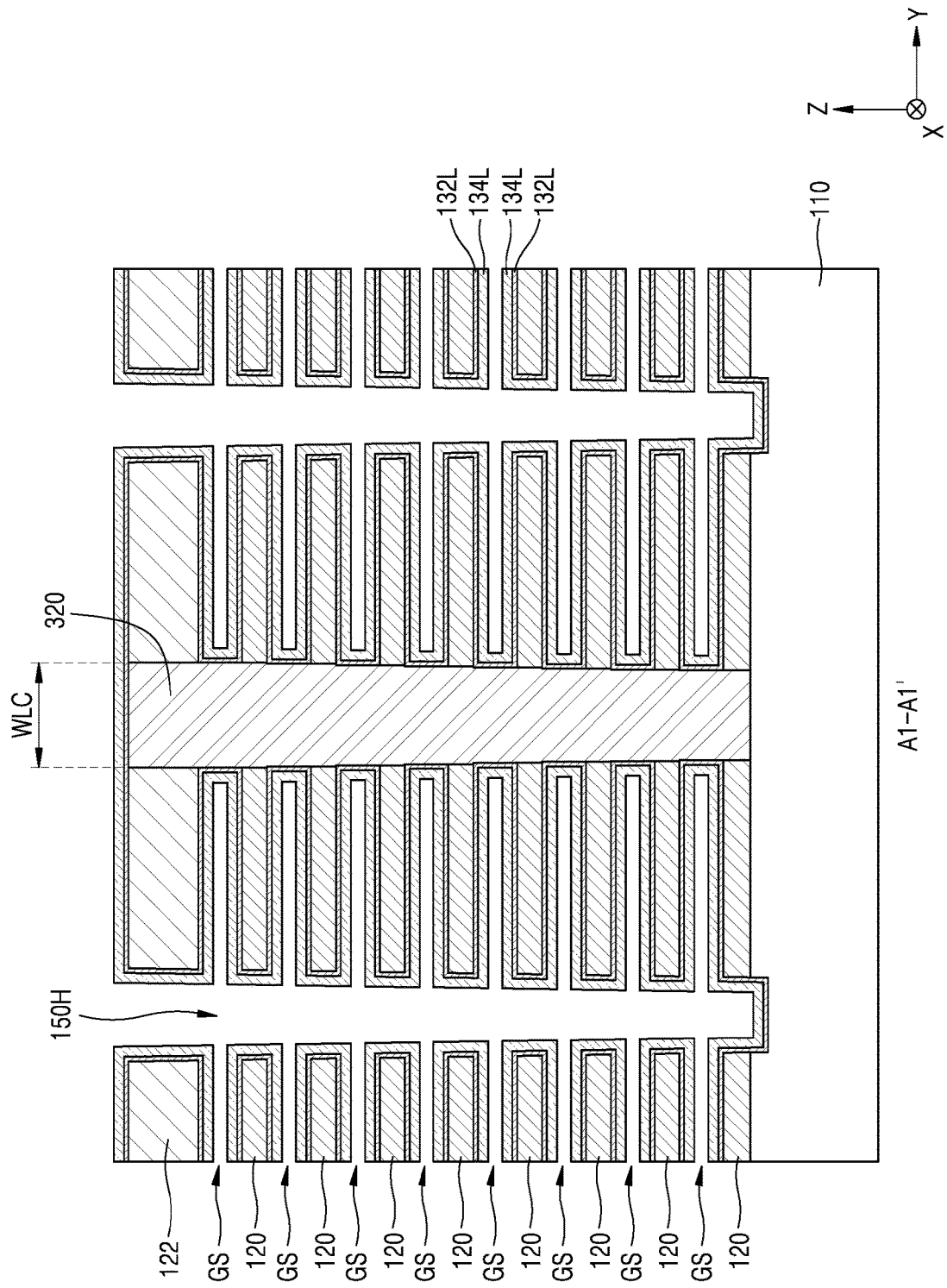

Referring to FIG. 16, the preliminary conductive barrier layer 132L and a preliminary metal layer 134L may be sequentially formed on the inner walls of the channel holes 150H and the plurality of gate spaces GS. The preliminary conductive barrier layer 132L and the preliminary metal layer 134L may be conformally formed on the surfaces of the insulating layers 120 exposed at the inner walls of the channel hole 150H and the plurality of gate spaces GS, on sidewalls of the word line cut insulating layers 320 exposed in the plurality of gate spaces GS and on the first top insulating layer 122. The inside of the channel hole 150H and the plurality of gate spaces GS are not entirely filled.

Figure 17:
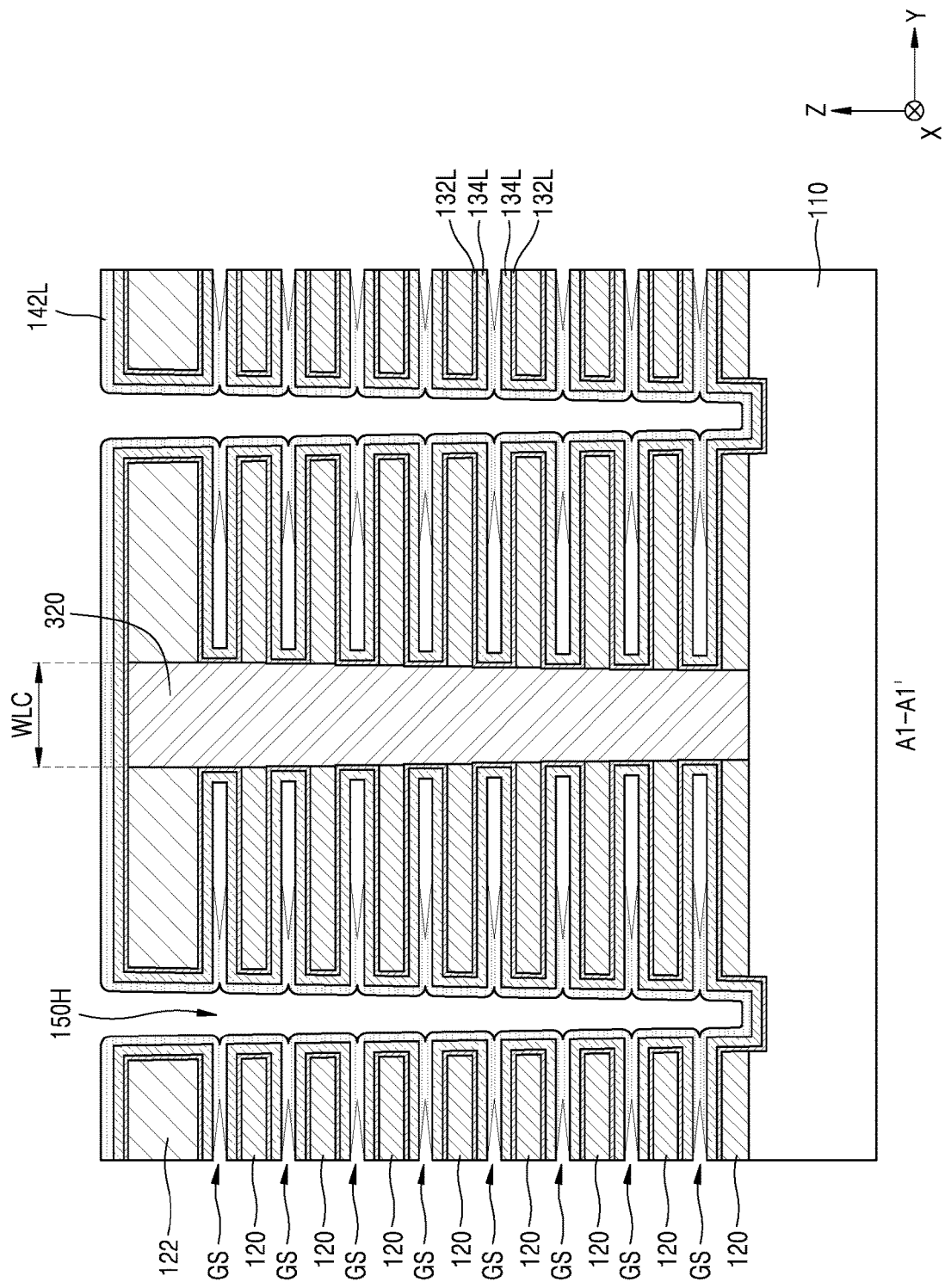

Referring to FIG. 17, a preliminary first cover insulating layer 142L may be formed on the preliminary metal layer 134L arranged on the inner wall of the channel hole 150H. The preliminary first cover insulating layer 142L may include an insulating material having poor step coverage characteristics and may fill a portion of the plurality of gate spaces GS communicated with the channel hole 150H. Accordingly, a portion of the plurality of gate spaces GS that are relatively far from the channel hole 150H may not be filled by the preliminary first cover insulating layer 142L, but may remain empty.

Figure 18:
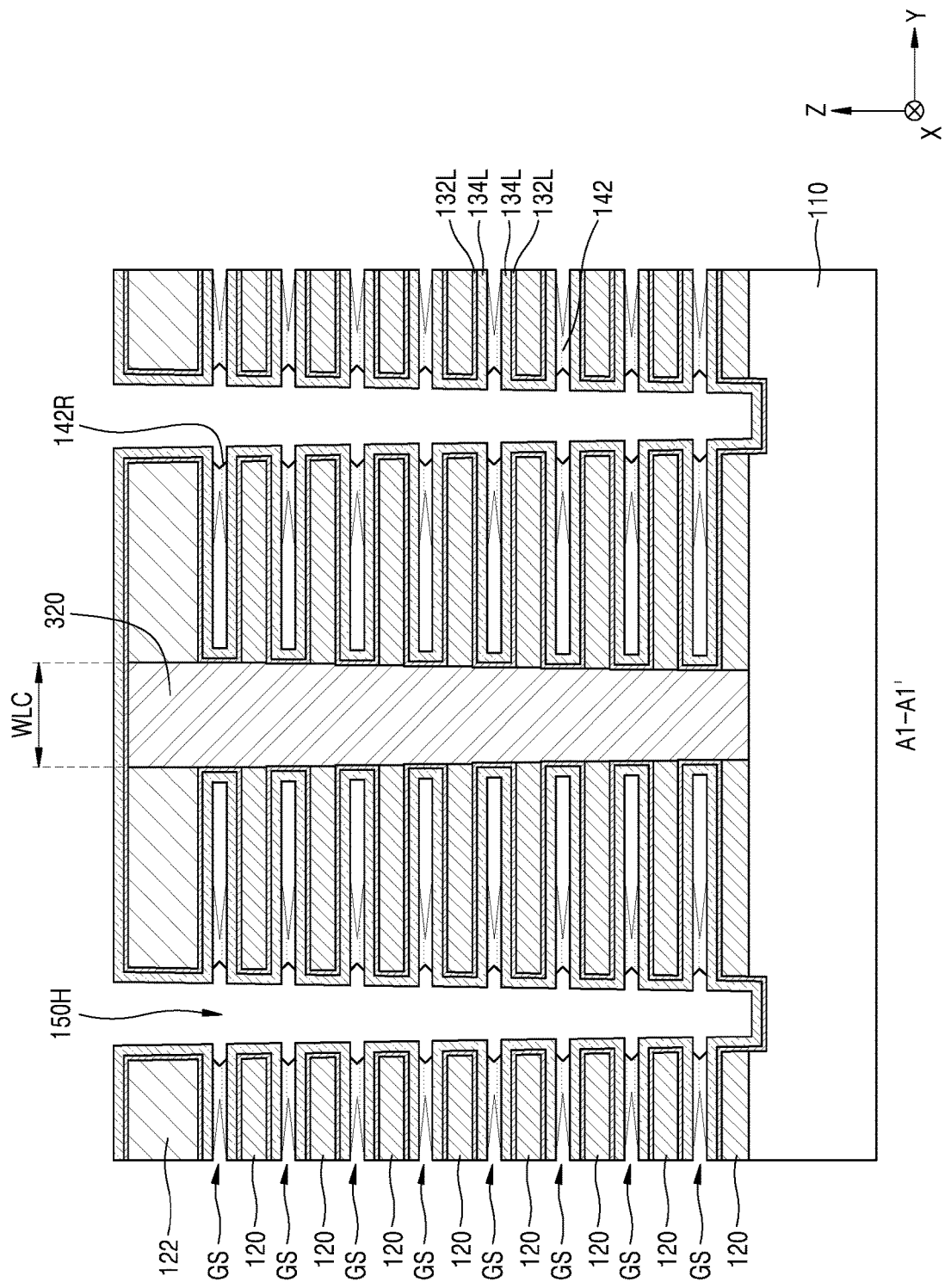

Referring to FIG. 18, a portion of the preliminary first cover insulating layer 142L arranged on (or over) the first top insulating layer 122 and on the inner wall of the channel hole 150H may be removed, and the plurality of first cover insulating layers 142 may be formed in the plurality of gate spaces GS. Accordingly, the preliminary metal layer 134L may be exposed again on the sidewall and the bottom portion of the channel hole 150H. In example embodiments, a process for removing a portion of the preliminary first cover insulating layer 142L may be a wet etching process. In some embodiments, after the wet etching process, the plurality of first cover insulating layers 142 may include the recess 142R, which is inwardly recessed with respect to the preliminary metal layer 134L on the sidewall of the channel hole 150H.

Figure 19:
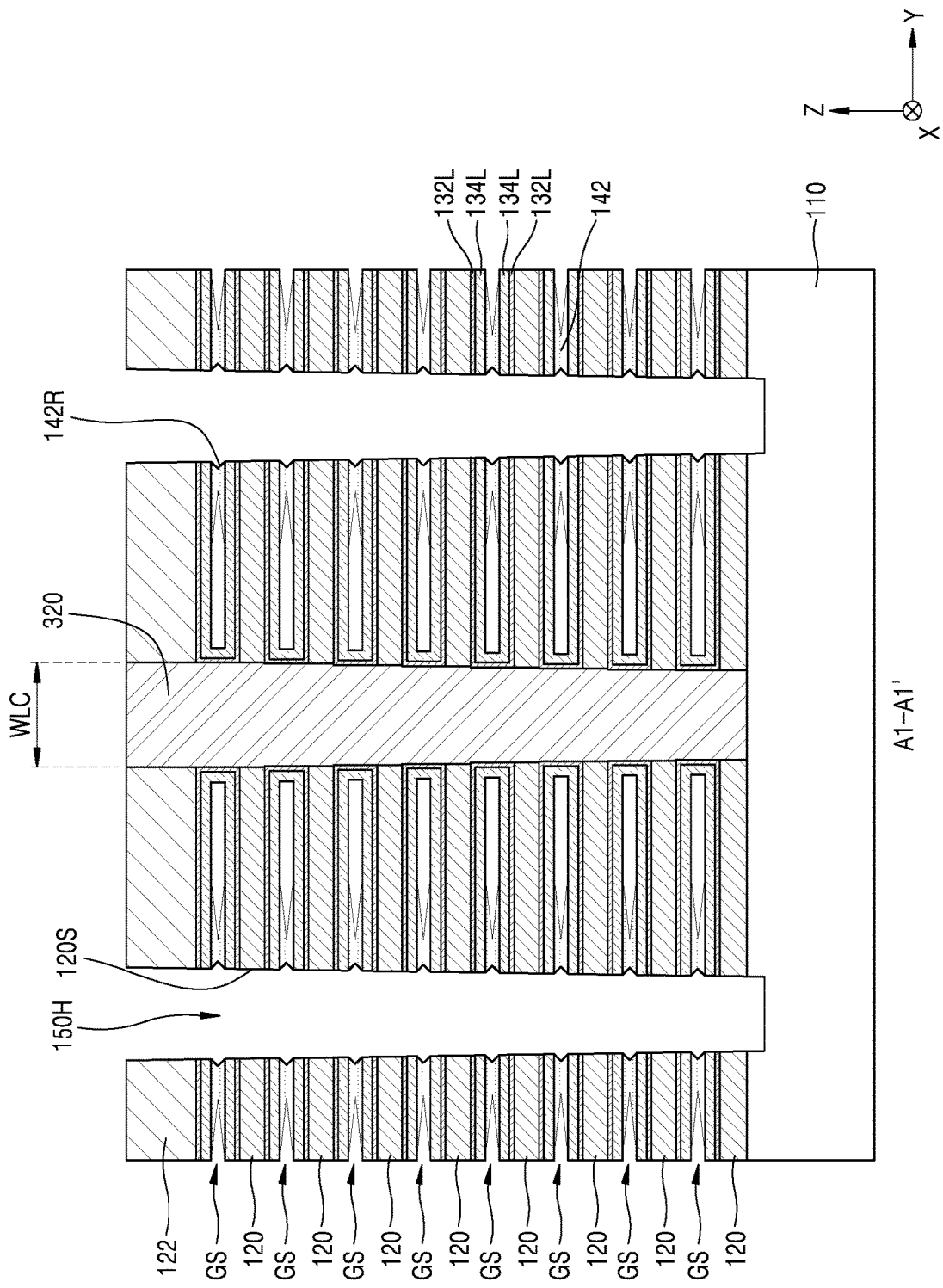

Referring to FIG. 19, portions of the preliminary metal layer 134L and the preliminary conductive barrier layer 132L on the inner wall of the channel hole 150H may be removed, and accordingly, the plurality of insulating layers 120 may be exposed at the inner wall of the channel hole 150H.

In example embodiments, by performing a first wet etching process using a first etchant capable of removing the preliminary metal layer 134L, a portion of the preliminary metal layer 134L on the inner wall of the channel hole 150H may be first removed to expose the surface of the preliminary conductive barrier layer 132L. Next, by performing a second wet etching process using a second etchant capable of removing the preliminary conductive barrier layer 132L, a portion of the preliminary conductive barrier layer 132L on the inner wall of the channel hole 150H may be removed. However, the removal process of the portion of the preliminary conductive barrier layer 132L and the portion of the preliminary metal layer 134L is not limited to the above-described etching processes.

For example, a portion of the preliminary conductive barrier layer 132L and a portion of the preliminary metal layer 134L that cover the sidewall 120S of the insulating layer 120 on the inner wall of the channel hole 150H may be removed by a wet etching process, and the sidewall 120S of the insulating layer 120 may be exposed. In addition, a portion of the preliminary conductive barrier layer 132L and a portion of the preliminary metal layer 134L on the first top insulating layer 122 may be removed together, and a top surface of the first top insulating layer 122 may be exposed again.

Figure 20:
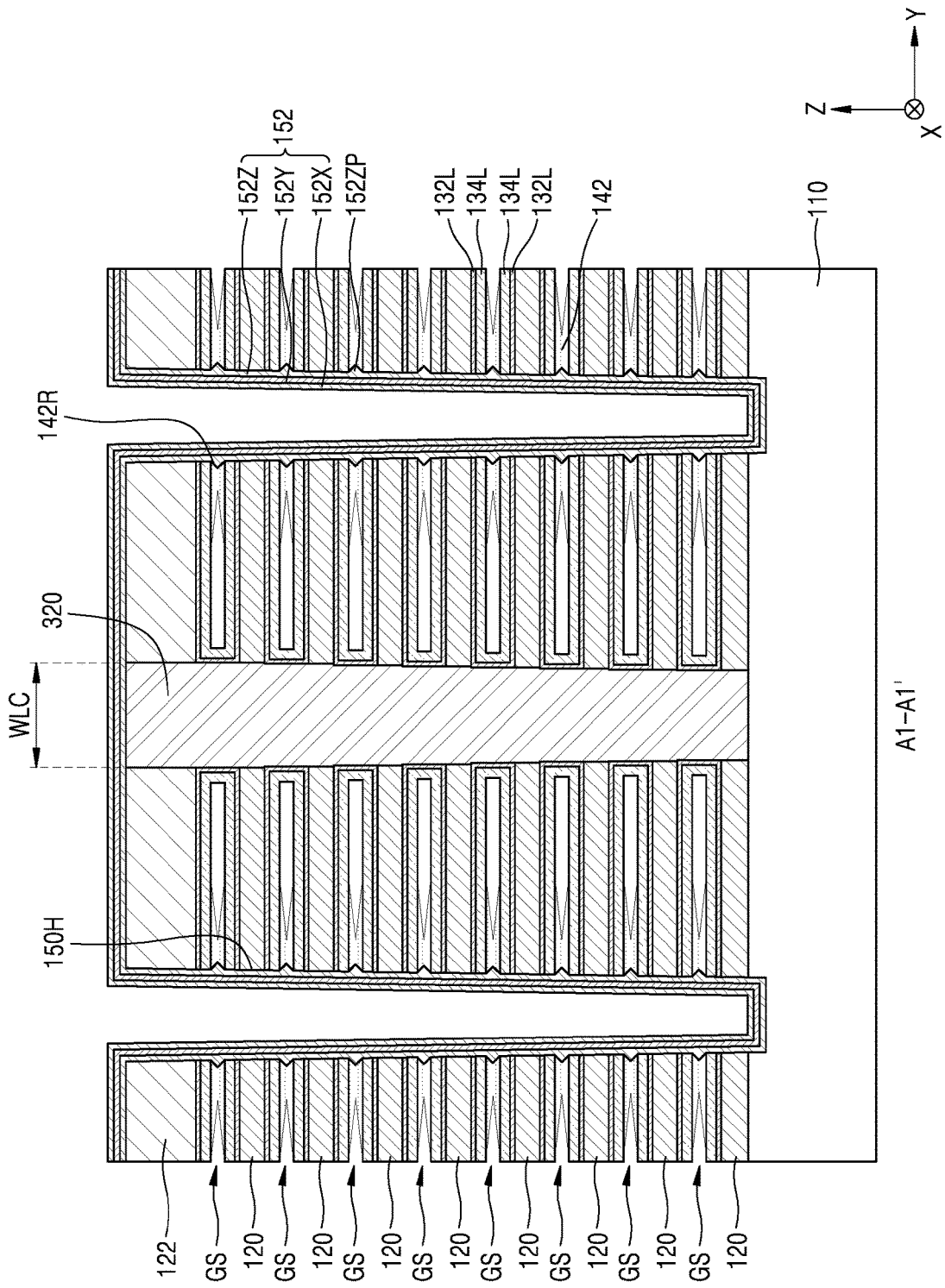

Referring to FIG. 20, the blocking dielectric layer 152Z, the charge storage layer 152Y, and the tunneling dielectric layer 152X may be sequentially formed on the inner wall of the channel hole 150H to form the gate insulating layer 152. The gate insulating layer 152 may contact the sidewall of the first cover insulating layer 142 on the inner wall of the channel hole 150H, and for example, the first protrusion 152ZP conforming to a shape of the recess 142R may be formed in the portion of the gate insulating layer 152 contacting the recess 142R of the first cover insulating layer 142. However, the shape or size of the recess 142R and the first protrusion 152ZP are not limited to those illustrated in FIG. 20.

Figure 21:
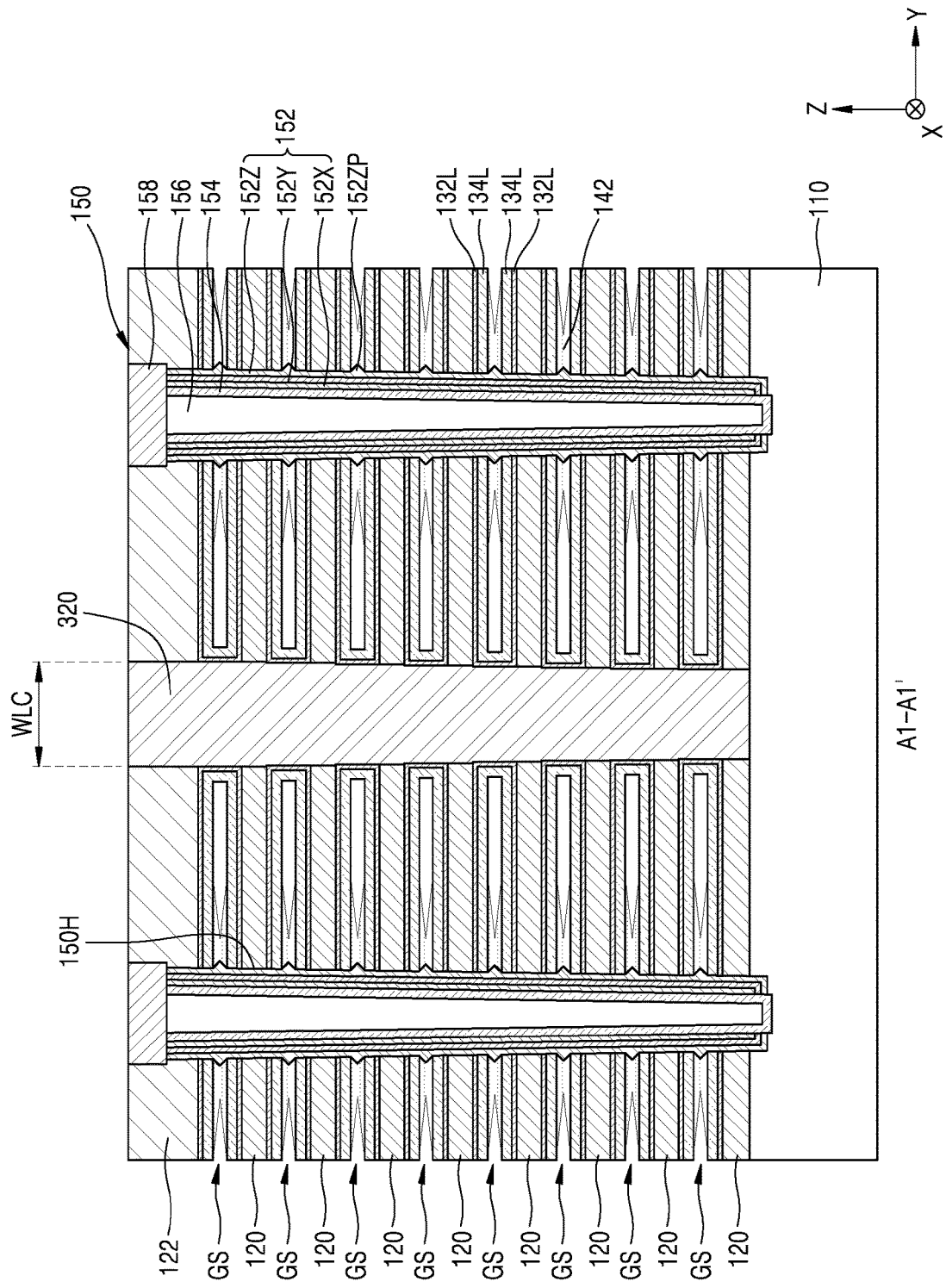

Referring to FIG. 21, by performing an anisotropic etching process or an etch-back process on the gate insulating layer 152, a portion of the gate insulating layer 152 covering the bottom portion of the channel hole 150H may be removed. By the anisotropic etching process or the etch-back process, a portion of the substrate 110 exposed at the bottom portion of the channel hole 150H may be further removed to a certain depth.

Next, the channel layer 154 may be conformally formed on the inner wall of the channel hole 150H. The filling insulating layer 156 filling a remaining portion of the channel hole 150H may be formed by using an insulating material on the channel layer 154. By removing a portion of the channel layer 154 and a portion of the filling insulating layer 156 (and a portion of the gate insulating layer 152) which are arranged in the top portion of the channel hole 150H by an etch-back process, and by filling the removed portions of the top portion of the channel hole 150H with a conductive material, the conductive plug 158 may be formed.

Figure 22:
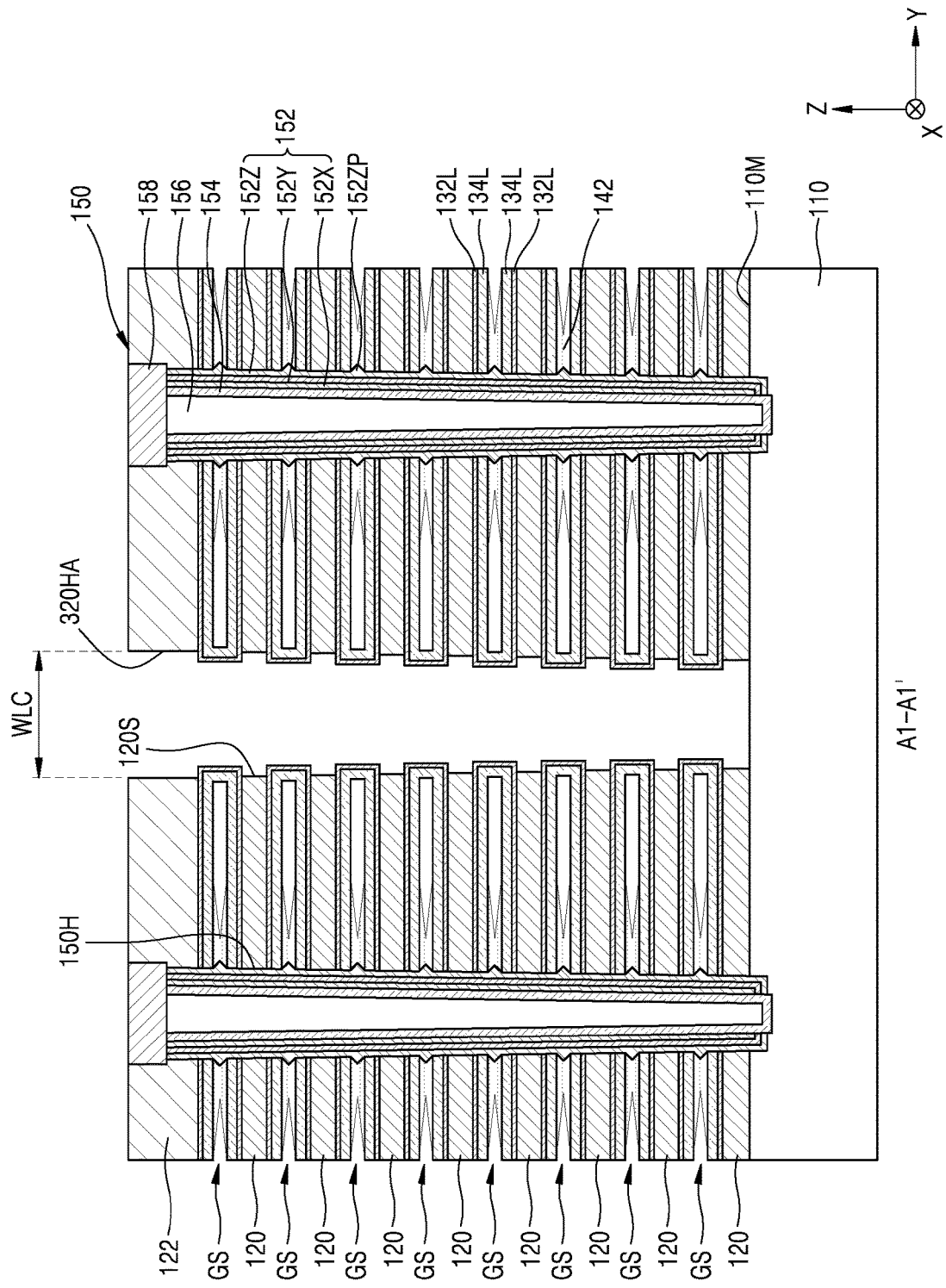

Referring to FIG. 22, a mask pattern (not shown) may be formed on the first top insulating layer 122 and the word line cut insulating layer 320 (refer to FIG. 21), and a portion of the word line cut insulating layer 320 may be removed by using the mask pattern as an etching mask, to form a word line cut opening 320HA. Next, by performing a wet etching process, the remaining portion of the word line cut insulating layer 320, the first top insulating layer 122, and the plurality of insulating layers 120 may be further removed by a certain thickness. The word line cut opening 320HA may further laterally extend by the wet etching process, and the sidewall 120S of the insulating layer 120 may be inwardly recessed with respect to a sidewall of the preliminary conductive barrier layer 132L (for example, in a direction toward the channel structure 150).

Figure 23:
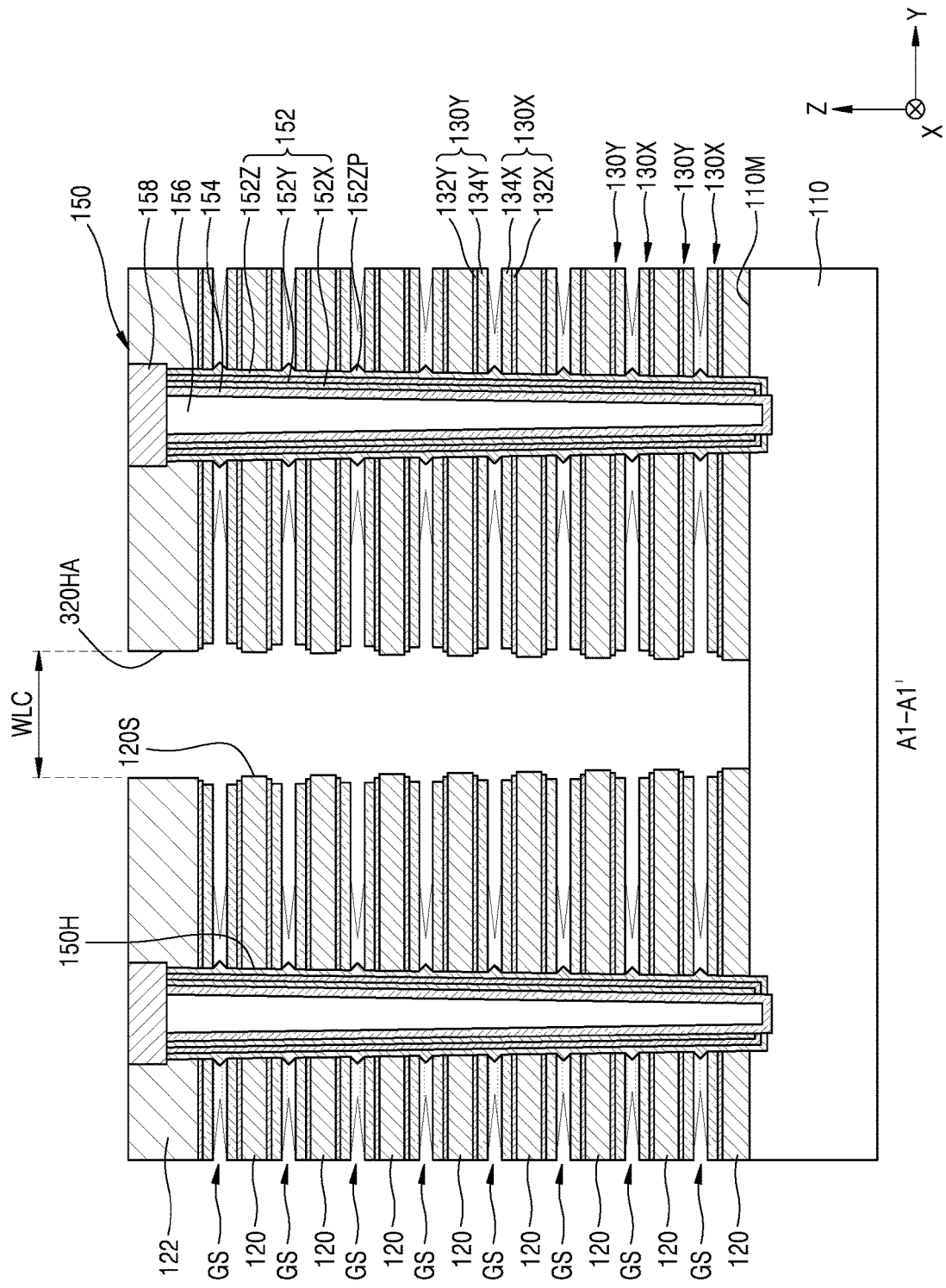

Referring to FIG. 23, portions of the preliminary metal layer 134L and the preliminary conductive barrier layer 132L on the inner wall of the word line cut opening 320HA may be removed, and accordingly, the plurality of gate spaces GS may communicate with and be exposed at the word line cut opening 320HA.

In example embodiments, by performing the first wet etching process using a first etchant capable of removing the preliminary conductive barrier layer 132L, a portion of the preliminary conductive barrier layer 132L on the inner wall of the word line cut opening 320HA may be first removed to expose the surface of the preliminary metal layer 134L.

Next, by performing a second wet etching process using a second etchant capable of removing the preliminary metal layer 134L, a portion of the preliminary metal layer 134L on the inner wall of the word line cut opening 320HA may be removed. As a result, a portion of the preliminary conductive barrier layer 132L and a portion of the preliminary metal layer 134L that surround the gate space GS on the inner wall of the word line cut opening 320HA may be removed, and accordingly, the gate space GS may communicate with or be connected to the word line cut opening 320HA. However, the removal process of the portion of the preliminary conductive barrier layer 132L and the portion of the preliminary metal layer 134L is not limited to the above-described etching processes.

For example, a portion of the preliminary metal layer 134L and a portion of the preliminary conductive barrier layer 132L, which extend in the vertical direction (Z direction) and are arranged on the side wall of the word line cut insulating layer 320 (refer to FIG. 21), from among the preliminary metal layer 134L and the preliminary conductive barrier layer 132L, may be removed, and accordingly, only a portion of the preliminary metal layer 134L and a portion of the preliminary conductive barrier layer 132L that are arranged on the top surface and the bottom surface of the insulating layer 120 may remain. The preliminary metal layer 134L may be at a level lower than the preliminary conductive barrier layer 132L at an upper portion of one gate space GS, and the preliminary metal layer 134L may be at a level higher than the preliminary conductive barrier layer 132L at a lower portion of one gate space GS.

For example, a portion of the preliminary conductive barrier layer 132L on the top surface of the lower insulating layer 120 among the two adjacent insulating layers 120 may be referred to as the first conductive barrier layer 132X, a portion of the preliminary metal layer 134L on the first conductive barrier layer 132X over the top surface of the lower insulating layer 120 may be referred to as the first metal layer 134X, a portion of the preliminary conductive barrier layer 132L on the bottom surface of the top insulating layer 120 among two adjacent insulating layers 120 may be referred to as the second conductive barrier layer 132Y, and a portion of the preliminary metal layer 134L on the second conductive barrier layer 132Y under the bottom surface of the top insulating layer 120 may be referred to as the second metal layer 134Y. Here, in one gate space GS between two adjacent insulating layers 120, the first gate electrode 130X including the first conductive barrier layer 132X and the first metal layer 134X, and the second gate electrode 130Y including the second conductive barrier layer 132Y and the second metal layer 134Y may be formed. Accordingly, the first gate electrode 130X and the second gate electrode 130Y may have a mirrored-symmetric shape with respect to each other based on the center line in the vertical direction (Z direction) of the gate space GS. The first gate electrode 130X and the second gate electrode 130Y may be apart from each other in the vertical direction (Z direction) in the memory cell region MCR.

Figure 24:
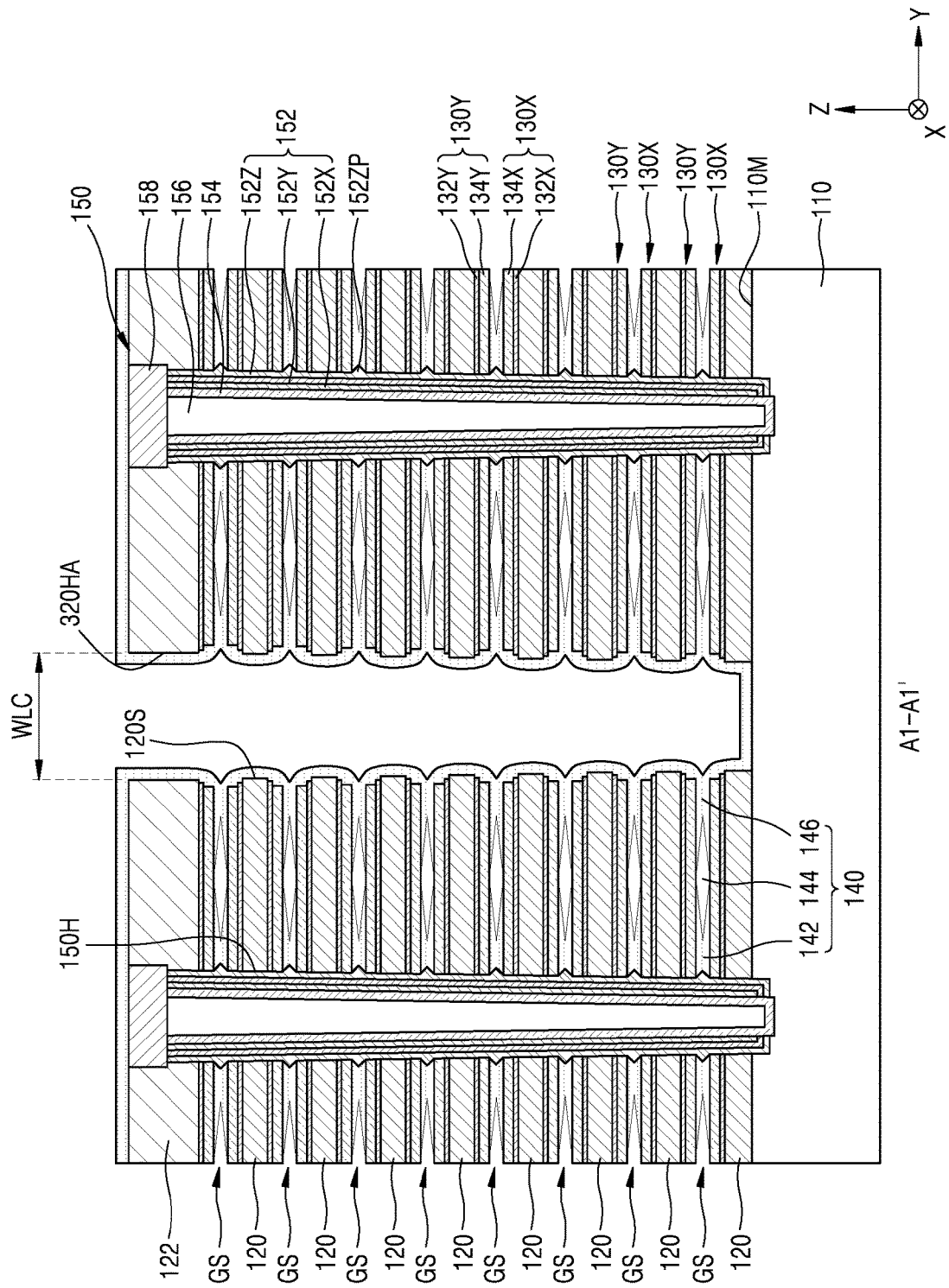

Referring to FIG. 24, the second cover insulating layer 146 may be formed on the top surface of the first top insulating layer 122 and on an inner wall of the word line cut opening 320HA. The second cover insulating layer 146 may be formed by using an insulating material having poor step coverage characteristics, and the second cover insulating layer 146 may fill a portion of the plurality of gate spaces GS communicated or connected with the word line cut opening 320HA. Some region of the plurality of gate spaces GS located relatively far from the word line cut opening 320HA may remain empty without being filled by the second cover insulating layer 146, and the empty region may be referred to as the air space 144. The air space 144 may denote a space that is defined between the first gate electrode 130X and the second gate electrode 130Y in the vertical direction (Z direction), and between the first cover insulating layer 142 and the second cover insulating layer 146 in the horizontal direction (X direction or Y direction). The shape and size of the air space 144 are not limited to those illustrated in FIG. 24. Here, the first cover insulating layer 142, the air space 144, and the second cover insulating layer 146 may be referred to as the cover insulating layer structure 140.

Figure 25:
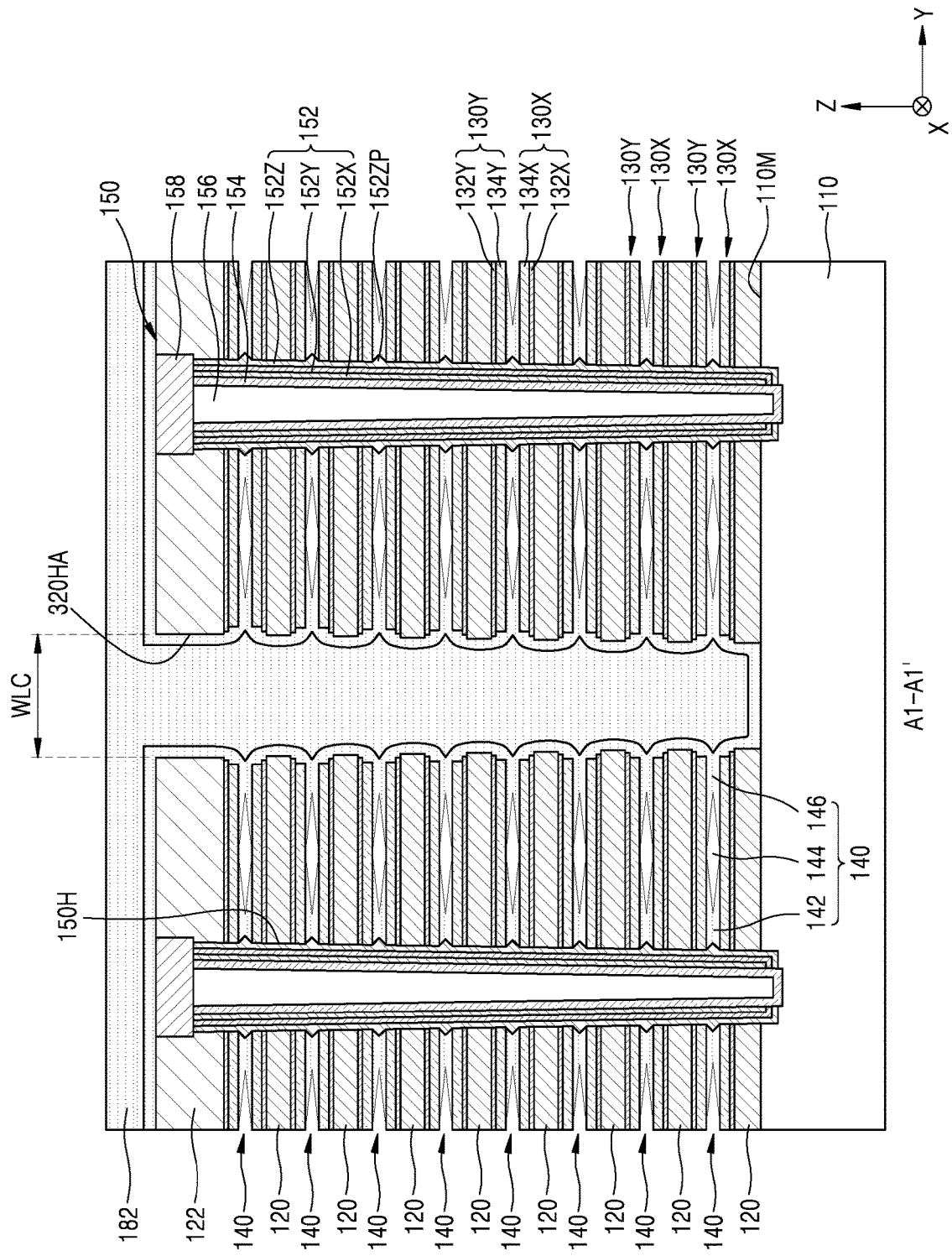

Referring to FIG. 25, the insulating spacer 182 may be formed on the inner wall of the word line cut opening 320HA. In example embodiments, the insulating spacer 182 may be formed to entirely fill the word line cut opening 320HA on the second cover insulating layer 146. In other embodiments, unlike as illustrated in FIG. 25, the insulating spacer 182 may be formed to have a relatively small thickness on the second cover insulating layer 146, and a portion of the word line cut opening 320HA may not be filled by the insulating spacer 182.

Figure 26:
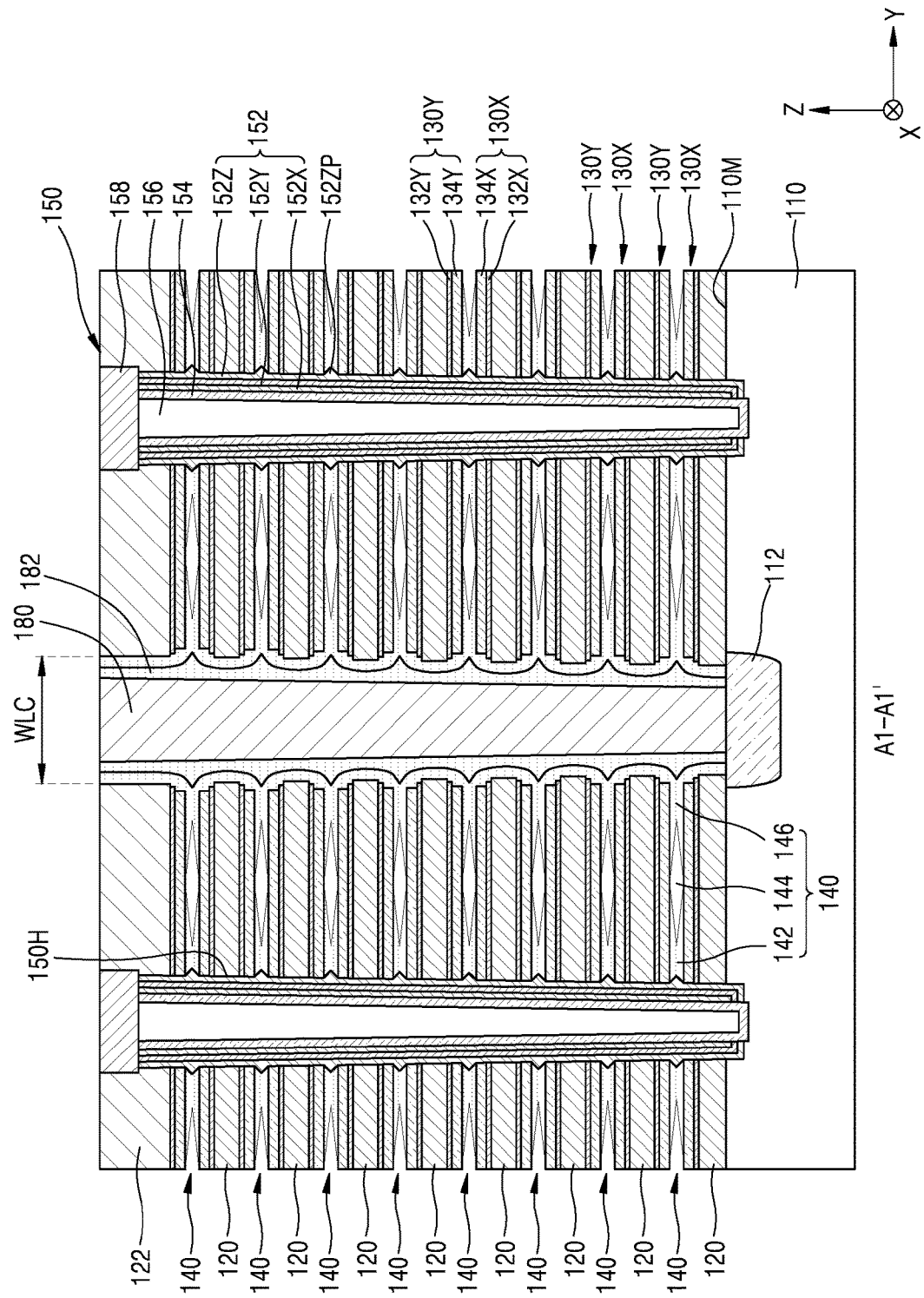

Referring to FIG. 26, a mask pattern (not illustrated) may be formed on the insulating spacer 182, and a portion of the insulating spacer 182 may be removed by using the mask pattern as an etching mask to expose the main surface 110M of the substrate 110. The common source region 112 may be formed in a portion of the substrate 110 under the insulating spacer 182 by implanting impurities into the exposed substrate 110. Next, the common source line 180 may be formed by using a conductive material in a portion where the insulating spacer 182 has been removed.

Referring to FIG. 3 again, the second top insulating layer 124 may be formed on the first top insulating layer 122, and the bit line contact BLC that passes through the second top insulating layer 124 and electrically contacts the channel structure 150 via the conductive plug 159S may be further formed. Next, the bit line BL that is connected to the bit line contact BLC and extends in the second direction (Y direction) may be further formed on the second top insulating layer 124.

The semiconductor device 100 may be completed by performing the above-described processes.

According to the fabrication method of the semiconductor device 100 described above, the sacrificial layer 310 exposed by the channel hole 150H may be removed, then the preliminary conductive barrier layer 132L and the preliminary metal layer 134L may be formed in the gate space GS from which the sacrificial layer 310 has been removed, portions of the preliminary conductive barrier layer 132L and the preliminary metal layer 134L (that is, portions extending in the vertical direction of the preliminary conductive barrier layer 132L and the preliminary metal layer 134L) may be removed by using the channel hole 150H, and thereafter, other portions of the preliminary conductive barrier layer 132L and the preliminary metal layer 134L (that is, portions extending in the vertical direction of the preliminary conductive barrier layer 132L and the preliminary metal layer 134L) may be removed by using the word line cut opening 320HA. Accordingly, in a gate space GS where one sacrificial layer 310 has been removed, that is, in a space between two adjacent insulating layers 120, the pair of gate electrodes 130 including the first gate electrode 130X and the second gate electrode 130Y apart from each other may be formed.

Accordingly, the first gate electrode 130X and the second gate electrode 130Y may have relatively small thicknesses t11 and t12 (refer to FIG. 4), respectively, and the separation distance d11 (refer to FIG. 4) between the first gate electrode 130X and the second gate electrode 130Y may be relatively small. Thus, the vertical height of the semiconductor device 100 may be relatively reduced, and the occurrence of defects due to collapsing or falling of the mold stack during the fabrication process of the semiconductor device 100, for example, during the removal process of the sacrificial layer 310, may be reduced or prevented.

Figure 27:
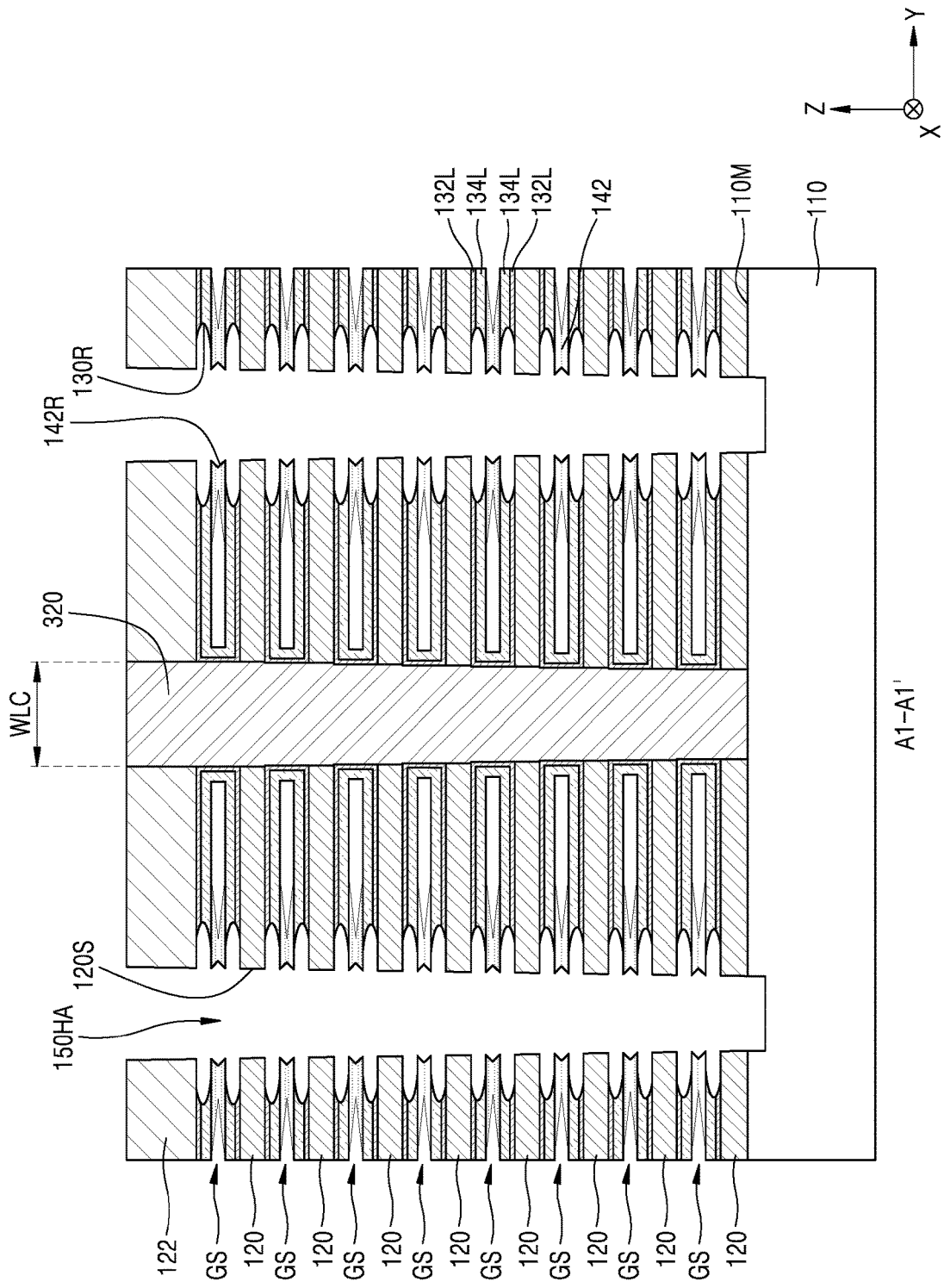
FIGS. 27 and 28 illustrate schematic diagrams of a fabrication method of a semiconductor device according to a process sequence of example embodiments of the inventive concepts.
Figure 28:
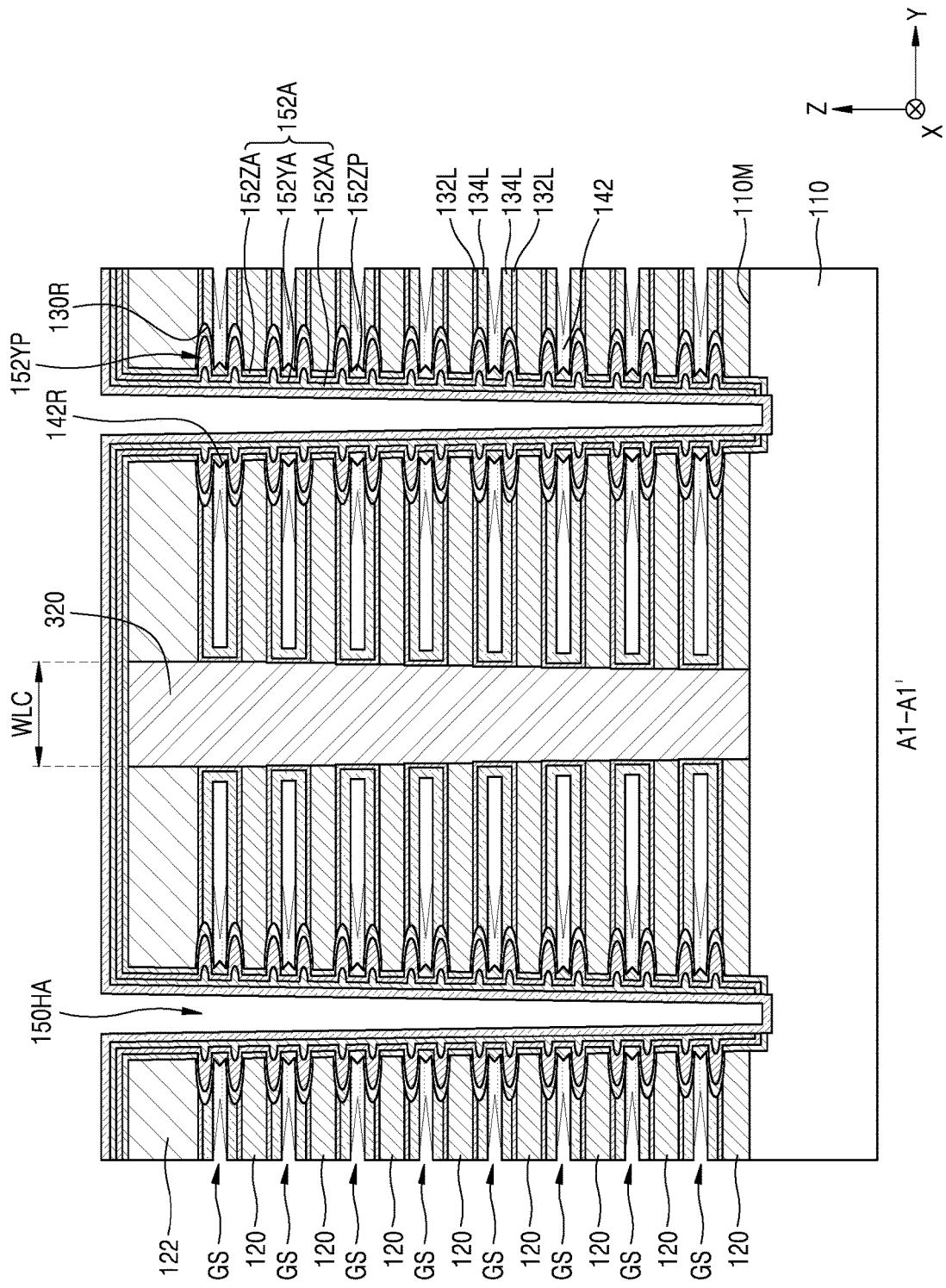

FIGS. 27 and 28 illustrate schematic diagrams of a fabrication method of the semiconductor device 100A according to a process sequence, according to example embodiments of the inventive concepts.

First, the plurality of first cover insulating layers 142 may be formed in the plurality of gate spaces GS by performing the processes described with reference to FIGS. 12 through 19, and the plurality of insulating layers 120 may be exposed at the inner wall of the channel hole 150HA.

Referring to FIG. 27, by performing a wet etching process, the preliminary conductive barrier layer 132L and the preliminary metal layer 134L exposed at the inner wall of the channel hole 150HA may be further etched in a lateral direction. Accordingly, the sidewalls of the preliminary conductive barrier layer 132L and the preliminary metal layer 134L may be inwardly recessed with respect to the sidewalls 120S of the plurality of insulating layers 120 (for example, in a direction toward the word line cut insulating layer 320), and the recess region 130R may be formed in a space where the preliminary conductive barrier layer 132L and the preliminary metal layer 134L have been removed. In addition, the sidewalls of the preliminary conductive barrier layer 132L and the preliminary metal layer 134L may be inwardly recessed (for example, in a direction toward the word line cut insulation layer 320) with respect to the sidewall of the first cover insulating layer 142.

In example embodiments, by performing a first wet etching process using a first etchant capable of removing the preliminary metal layer 134L, a portion of the preliminary metal layer 134L on the inner wall of the channel hole 150HA may be first etched in a lateral direction, and then, by performing a second wet etching process using a second etchant capable of removing the preliminary conductive barrier layer 132L, a portion of the preliminary conductive barrier layer 132L on the inner wall of the channel hole 150HA may be removed in a lateral direction. However, the etching process in the lateral direction of the preliminary conductive barrier layer 132L and the preliminary metal layer 134L is not limited to the above-described example.

Referring to FIG. 28, the blocking dielectric layer 152ZA, the charge storage layer 152YA, and the tunneling dielectric layer 152XA may be sequentially formed on the inner wall of the channel hole 150HA to form the gate insulating layer 152A. The gate insulating layer 152A may contact the sidewall of the first cover insulating layer 142 on the inner wall of the channel hole 150H, and for example, the first protrusion 152ZP conforming to the shape of the recess 142R may be formed in the portion of the gate insulating layer 152A contacting the recess 142R of the first cover insulating layer 142. In addition, the gate insulating layer 152A may contact the sidewalls of the preliminary conductive barrier layer 132L and the preliminary metal layer 134L on the inner wall of the channel hole 150HA, and for example, the second protrusion 152YP conforming to the shape of the recess region 130R may be formed in a portion of the gate insulating layer 152 that contacts the recess region 130R of the preliminary conductive barrier layer 132L and the preliminary metal layer 134L. However, the shapes or sizes of the first protrusion 152ZP and the second protrusion 152YP are not limited to those illustrated in FIG. 28.

Thereafter, the semiconductor device 100A may be completed by performing the processes described with reference to FIGS. 21 through 26.

According to the fabrication method of the semiconductor device 100A according to the example embodiments described above, the occurrence of defects due to collapsing or falling of the mold stack in the fabrication process of the semiconductor device 100A may be reduced or prevented. In addition, since the gate insulating layer 152A includes the second protrusion 152YP, data loss may be prevented, and reliability of the semiconductor device 100A may be improved.

While the inventive concepts have been particularly shown and described with reference to embodiments thereof, it should be understood that various changes in form and detail may be made therein without departing from the spirit and scope of the following claims.

What is claimed is:
1. A semiconductor device comprising:
a channel structure arranged on a substrate and extending in a first direction perpendicular to a top surface of the substrate, the channel structure comprising a channel layer and a gate insulating layer;
a plurality of insulating layers arranged on the substrate and surrounding the channel structure, the plurality of insulating layers spaced apart from each other in the first direction;
a plurality of first gate electrodes surrounding the channel structure;
a plurality of second gate electrodes surrounding the channel structure; and
a cover insulating layer structure disposed between the first gate electrode and the second gate electrode, wherein:
a first gate electrode, among the plurality of first gate electrodes, and a second gate electrode, among the plurality of second gate electrodes, are disposed between immediately-adjacent insulating layers among the plurality of insulating layers, and
the first gate electrode and the second gate electrode are spaced apart along the first direction,
the cover insulating layer structure comprises:
a first cover insulating layer surrounding a portion of a sidewall of the channel structure between the first gate electrode and the second gate electrode;
a second cover insulating layer arranged as surrounding an edge portion of the first gate electrode and an edge portion of the second gate electrode both adjacent to a word line cut region, and as between the first gate electrode and the second gate electrode; and
an air space disposed between the first cover insulating layer and the second cover insulating layer,
the first gate electrode comprises a first conductive barrier layer and a first metal layer that are sequentially arranged on a top surface of a lower insulating layer from among the immediately-adjacent insulating layers, and
the first metal layer contacts the first cover insulating layer and the second cover insulating layer, and the first conductive barrier layer does not contact the first cover insulating layer.

2. The semiconductor device of claim 1, wherein:
the first gate electrode, a portion of the cover insulating layer structure, and the second gate electrode are sequentially arranged in the first direction.

3. The semiconductor device of claim 1, wherein the second gate electrode comprises a second conductive barrier layer and a second metal layer that are sequentially arranged on a bottom surface of an upper insulating layer from among the immediately-adjacent insulating layers.

4. The semiconductor device of claim 1, wherein:
the gate insulating layer surrounds an outer wall of the channel layer and extends in the first direction, and
the gate insulating layer comprises a sidewall, and a plurality of first protrusions formed on the sidewall of the gate insulating layer and protruding outwardly.

5. The semiconductor device of claim 4, wherein the first protrusions protrude outwardly to be surrounded by the first cover insulating layer disposed between respective pairs of the immediately-adjacent insulating layers.

6. The semiconductor device of claim 4, wherein:
the gate insulating layer comprises a plurality of second protrusions formed on the sidewall of the gate insulating layer and protruding outwardly, and
the second protrusions respectively protrude outwardly to be surrounded by one of the plurality of first gate electrodes and the plurality of second gate electrodes.

7. The semiconductor device of claim 6, wherein the gate insulating layer comprises a charge storage layer, and the charge storage layer is arranged inside the plurality of second protrusions.

8. A semiconductor device comprising:
a channel structure arranged on a substrate and extending in a first direction perpendicular to a top surface of the substrate, the channel structure comprising a channel layer and a gate insulating layer;
a plurality of insulating layers arranged on the substrate and surrounding the channel structure, the plurality of insulating layers spaced apart from each other in the first direction;
a plurality of pairs of gate electrodes respectively arranged between immediately-adjacent insulating layers from among the plurality of insulating layers, each of the pairs of gate electrodes comprising a first gate electrode and a second gate electrode spaced apart from each other; and
cover insulating layer structures surrounding the channel structure between the first gate electrode and the second gate electrode of each of the plurality of pairs of gate electrodes, the cover insulating layer structures covering edge portions of the plurality of pairs of gate electrodes, wherein:
the cover insulating layer structures comprises:
a first cover insulating layer surrounding a portion of a sidewall of the channel structure between a first gate electrode from among the plurality of pairs of gate electrodes and a second gate electrode from among the plurality of pairs of gate electrodes;
a second cover insulating layer arranged as surrounding an edge portion of the first gate electrode from among the plurality of pairs of gate electrodes and an edge portion of the second gate electrode from among the plurality of pairs of gate electrodes both adjacent to a word line cut region; and
an air space disposed between the first cover insulating layer and the second cover insulating layer, the first gate electrode comprises a first metal layer arranged directly on a top surface of a lower insulating layer from among the immediately-adjacent insulating layers, the second gate electrode comprises a second metal layer arranged directly on a bottom surface of an upper insulating layer from among the immediately-adjacent insulating layers, and a portion of the second cover insulating layer, the first cover insulating layer, and the air space are arranged between the first metal layer and the second metal layer.

9. The semiconductor device of claim 8, wherein between each pair of the immediately-adjacent insulating layers are sequentially arranged in the first direction a first gate electrode from among the plurality of pairs of gate electrodes, a cover insulating layer structure from among the cover insulating layer structures, and a second gate electrode from among the plurality of pairs of gate electrodes.

10. The semiconductor device of claim 8, wherein the second cover insulating layer covers edge portions of the immediately-adjacent insulating layers that are adjacent to the word line cut region.

11. A semiconductor device comprising:
a channel structure arranged on a substrate and extending in a first direction perpendicular to a top surface of the substrate, the channel structure comprising a channel layer and a gate insulating layer;
a plurality of insulating layers arranged on the substrate and surrounding the channel structure, the plurality of insulating layers spaced apart from each other in the first direction;
a plurality of pairs of gate electrodes respectively arranged between immediately-adjacent insulating layers from among the plurality of insulating layers, each of the pairs of gate electrodes comprising a first gate electrode and a second gate electrode spaced apart from each other; and
cover insulating layers surrounding the channel structure between the first gate electrode and the second gate electrode of each of the plurality of pairs of gate electrodes, the cover insulating layers covering edge portions of the plurality of pairs of gate electrodes, the cover insulating layers having sidewalls recessed inwardly with respect to sidewalls of the plurality of insulating layers, wherein the first gate electrode comprises a first conductive barrier layer and a first metal layer that are sequentially arranged on a top surface of a lower insulating layer from among the immediately-adjacent insulating layers, the second gate electrode comprises a second conductive barrier layer and a second metal layer that are sequentially arranged on a bottom surface of an upper insulating layer from among the immediately-adjacent insulating layers, the cover insulating layers fill spaces between the each pair of the first gate electrode and the second gate electrode, the cover insulating layers include top surfaces that respectively contact bottom surfaces of the second metal layer of the second gate electrode, and bottom surfaces that respectively contact top surfaces of the first metal layer of the first gate electrode, and the cover insulating layers comprise low-k insulating material.

12. The semiconductor device of claim 11, wherein:
a sidewall of the first gate electrode adjacent to a word line cut region is recessed inwardly with respect to sidewalls of the plurality of insulating layers adjacent to the word line cut region, and
a sidewall of the second gate electrode adjacent to the word line cut region is recessed inwardly with respect to the sidewalls of the plurality of insulating layers.

* * * * *